United States Patent
Saito et al.

(10) Patent No.: US 11,578,996 B2
(45) Date of Patent: *Feb. 14, 2023

(54) POSITION DETECTION ELEMENT AND POSITION DETECTION APPARATUS USING SAME

(71) Applicant: Alps Alpine Co., Ltd., Tokyo (JP)

(72) Inventors: Masamichi Saito, Miyagi-ken (JP); Fumihito Koike, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 266 days.

This patent is subject to a terminal disclaimer.

(21) Appl. No.: 16/909,623

(22) Filed: Jun. 23, 2020

(65) Prior Publication Data

US 2020/0318996 A1 Oct. 8, 2020

Related U.S. Application Data

(63) Continuation of application No. PCT/JP2018/046841, filed on Dec. 19, 2018.

(30) Foreign Application Priority Data

Dec. 26, 2017 (JP) .............................. JP2017-249082

(51) Int. Cl.
 *G01D 5/16* (2006.01)
 *G01R 33/09* (2006.01)
 *B62D 15/02* (2006.01)

(52) U.S. Cl.
 CPC ............. *G01D 5/16* (2013.01); *B62D 15/024* (2013.01)

(58) Field of Classification Search
 CPC ................................ G01D 5/16; B62D 15/024
 See application file for complete search history.

(56) References Cited

U.S. PATENT DOCUMENTS

| 7,023,670 B2 | 4/2006 | Saito |
| 8,786,280 B2 | 7/2014 | Yamazaki et al. |
| 2020/0348375 A1* | 11/2020 | Saito ................. H01L 43/02 |

FOREIGN PATENT DOCUMENTS

| JP | 2002-303536 | 10/2002 |
| JP | 2003-338644 | 11/2003 |
| JP | 2011-47930 | 3/2011 |

OTHER PUBLICATIONS

International Search Report from corresponding International Application No. PCT/JP2018/046841, 3pgs, dated Mar. 5, 2019.

* cited by examiner

*Primary Examiner* — Minh Q Phan
(74) *Attorney, Agent, or Firm* — Crowell & Moring LLP

(57) ABSTRACT

A position detection element includes an exchange coupling film having a large exchange coupling magnetic field and a position detection apparatus showing good detection accuracy in a high temperature environment. The position detection element includes an exchange coupling film composed of a fixed magnetic layer and an antiferromagnetic layer stacked on the fixed magnetic layer. The antiferromagnetic layer includes an X(Cr—Mn) layer containing X that is one or more elements selected from the group consisting of platinum group metals and Ni and containing Mn and Cr. The X(Cr—Mn) layer includes a PtMn layer as a first region relatively closer to the fixed magnetic layer and a PtCr layer as a second region relatively farther from the fixed magnetic layer. The content of Mn in the first region is higher than the content of Mn in the second region.

17 Claims, 25 Drawing Sheets

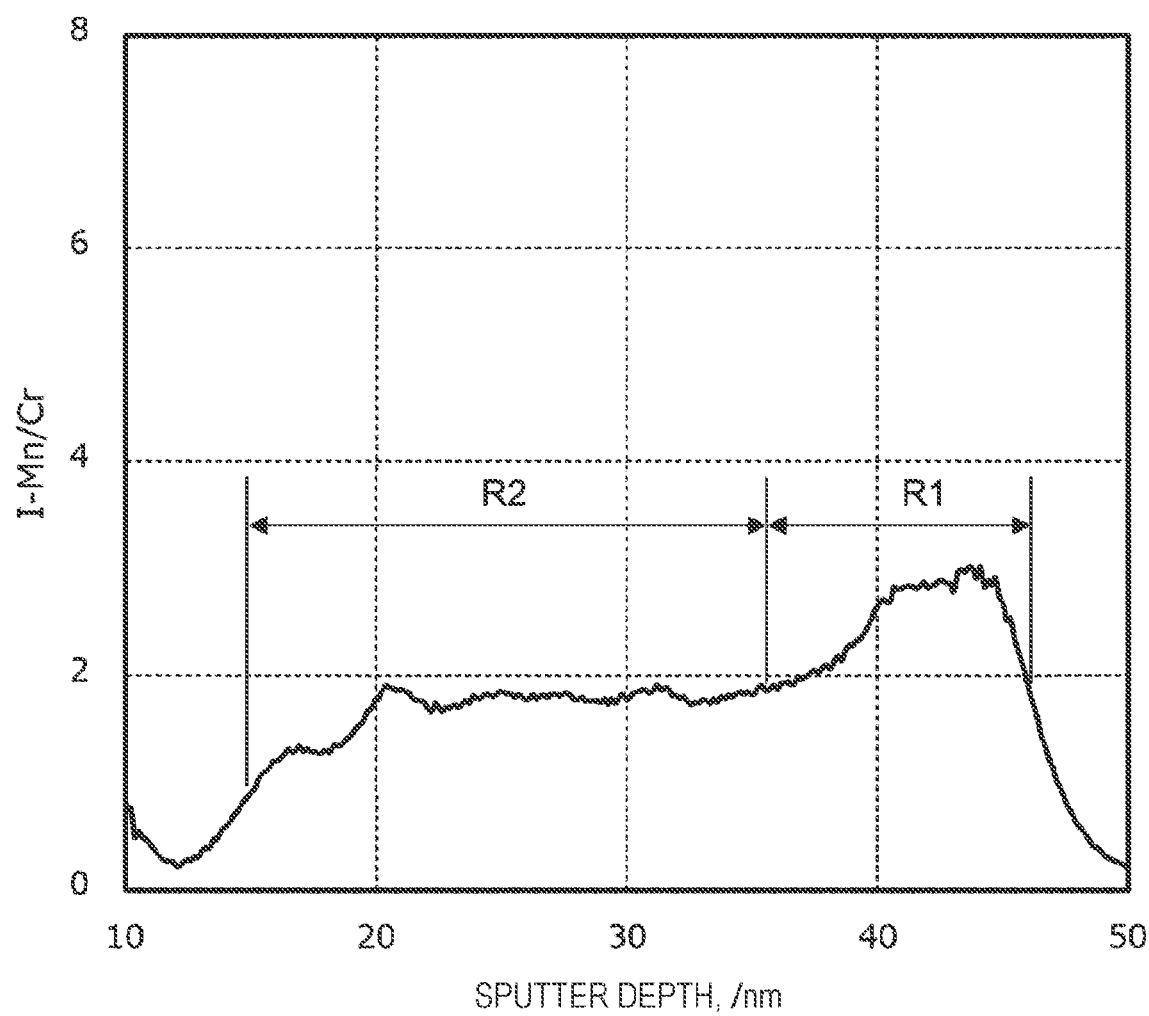

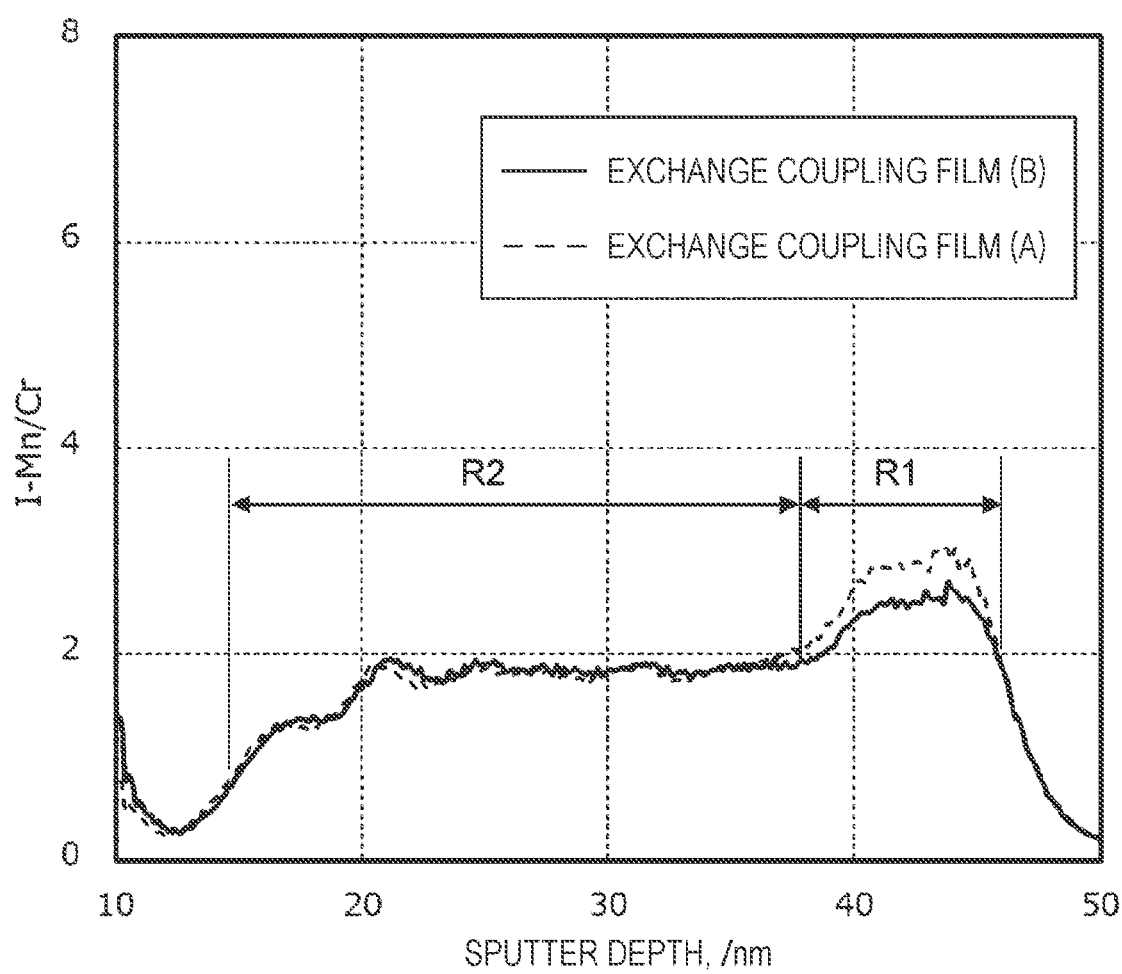

POSITION DETECTION ELEMENT AND POSITION DETECTION APPARATUS USING SAME

CLAIM OF PRIORITY

This application is a Continuation of International Application No. PCT/JP2018/046841 filed on Dec. 19, 2018, which claims benefit of priority to Japanese Patent Application No. 2017-249082 filed on Dec. 26, 2017. The entire contents of each application noted above are hereby incorporated by reference.

BACKGROUND

1. Field of the Disclosure

The present disclosure relates to a position detection element that is used for detecting, for example, the rotation angle of an automobile steering wheel and a position detection apparatus using the element.

2. Description of the Related Art

A magnetoresistance effect element, such as a GMR (giant magnetoresistance effect) element or a TMR (tunnel magnetoresistance effect) element, is used as a position detection element for detecting the position of an object. One of causes of a decrease in detection accuracy of a position detection apparatus is, for example, that the magnetization direction of a fixed magnetic layer (pinned layer) of a magnetoresistance effect element slight changes from a predetermined direction by an influence of the magnetic field such as a magnet disposed in the detection object. In particular, since the exchange coupling magnetic field of an antiferromagnetic film is decreased with an increase in temperature, the magnetization direction of a fixed magnetic layer that is exchange coupled with an antiferromagnetic film easily changes in a high temperature environment. Accordingly, in order to increase the detection accuracy of a position detection apparatus in a high temperature environment, it is preferable to use a magnetoresistance effect element including an antiferromagnetic film having a large exchange coupling magnetic field and a good temperature characteristic as a position detection element. As examples of the antiferromagnetic film of a magnetoresistance effect element, for example, films of PtMn or IrMn are disclosed (Japanese Unexamined Patent Application Publication No. 2002-303536 and Japanese Unexamined Patent Application Publication No. 2011-47930).

Recently, since position detection apparatuses are used in high temperature environments in some cases, they are required to maintain high detection accuracy even in high temperature environments. In order to maintain high detection accuracy in high temperature conditions, it is necessary to maintain the magnetization direction of a fixed magnetic layer of a magnetoresistance effect element in a predetermined direction. However, in magnetoresistance effect elements including antiferromagnetic films of PtMn described in Japanese Unexamined Patent Application Publication No. 2002-303536 or of IrMn described in Japanese Unexamined Patent Application Publication No. 2011-47930, the intensity of the exchange coupling is insufficient. Consequently, the magnetization direction of the fixed magnetic layer shifts from a predetermined direction in a high temperature environment, which has been one of the causes of a decrease in accuracy of position detection apparatuses in high temperature conditions.

SUMMARY

The present disclosure provides a position detection element including an exchange coupling film having a large exchange coupling magnetic field for suppressing a change in the magnetization direction of a fixed magnetic layer from a predetermined direction due to an influence of a magnetic field, such as an external magnetic field or a magnet disposed in a detection object, and a position detection apparatus showing good detection accuracy in a high temperature environment.

In one aspect, a position detection element is used for position detection based on a magnetic field that changes depending on the position of a detection object. The position detection element includes an exchange coupling film including a fixed magnetic layer and an antiferromagnetic layer stacked on the fixed magnetic layer. The antiferromagnetic layer includes an X(Cr—Mn) layer containing X that is one or more elements selected from the group consisting of platinum group metals and Ni and containing Mn and Cr. The X(Cr—Mn) layer includes a first region relatively closer to the fixed magnetic layer and a second region relatively farther from the fixed magnetic layer, and the content of Mn in the first region is higher than the content of Mn in the second region.

In the exchange coupling film of the position detection apparatus, the antiferromagnetic layer includes an X(Cr—Mn) layer, the X(Cr—Mn) layer includes a first region and a second region, and the content of Mn in the first region is higher than the content of Mn in the second region. In such a configuration, the exchange coupling magnetic field Hex easily becomes larger than the coercive force Hc, and the exchange coupling has excellent high-magnetic field resistance. In a preferable aspect, a negative value of the M0/Ms ratio and a large absolute value thereof are achieved, and the exchange coupling film thereby has particularly excellent high-magnetic field resistance.

As a specific aspect of the position detection element, the antiferromagnetic layer may be formed by stacking a PtCr layer and an $X^0$Mn layer (where, $X^0$ is one or more elements selected from the group consisting of platinum group metals and Ni) that is closer to the fixed magnetic layer than the PtCr layer.

In another aspect, this disclosure provides a position detection element for detecting the position of a detection object based on a magnetic field that changes depending on the position of the detection object. The position detection element includes an exchange coupling film including a fixed magnetic layer and an antiferromagnetic layer stacked on the fixed magnetic layer. The antiferromagnetic layer has an alternately stacked structure composed of three or more layers in which an $X^1$Cr layer (where, $X^1$ is one or more elements selected from the group consisting of platinum group metals and Ni) and an $X^2$Mn layer (where, $X^2$ is one or more elements selected from the group consisting of platinum group metals and Ni and may be the same as or different from $X^1$) are alternately stacked.

In another aspect, this disclosure provides a position detection element that is used for position detection based on a magnetic field that changes depending on the position of a detection object. The position detection element includes an exchange coupling film including a fixed magnetic layer and an antiferromagnetic layer stacked on the fixed magnetic layer. The antiferromagnetic layer includes an X(Cr—Mn) layer containing X that is one or more elements selected from the group consisting of platinum group metals and Ni and containing Mn and Cr. The X(Cr—Mn) layer includes a first region relatively closer to the ferromagnetic layer and a second region relatively farther from the ferromagnetic layer. When the X(Cr—Mn) layer is measured by time-on-flight secondary ion mass spectrometry using a $Bi^+$ ion as the primary ion to determine a first intensity ratio, which is the ratio of the detected intensities of 7 types of ions related to Mn to the detected intensities of 7 types ions excluding $Cr^+$ out of 8 types of ions to be measured related to Cr, the first intensity ratio in the first region is higher than the first intensity ratio in the second region, and Mn is contained in the entire second region. Incidentally, in the present specification, the first intensity ratio may be mentioned as "I—Mn/Cr".

In another aspect, this disclosure provides a position detection apparatus that is used for detecting the position of a detection object based on a magnetic field that changes depending on the position of the detection object, and the position detection apparatus includes a magnet attached to the detection object and the above-described position detection element. The detection object may be a rotor, and the position detection apparatus may detect the angle of rotation of the rotor. Such a position detection apparatus may include a plurality of the position detection elements on a single substrate, and the fixed magnetic layers of some of the plurality of the position detection elements may have different fixed magnetization directions.

BRIEF DESCRIPTION OF THE DRAWINGS

FIG. 23B is a depth profile of I—Mn/Cr of the exchange coupling film (A);

FIG. 25B is a depth profile of I—Mn/Cr of the exchange coupling film (A).

DESCRIPTION OF THE EXEMPLARY EMBODIMENTS

Figure 1:
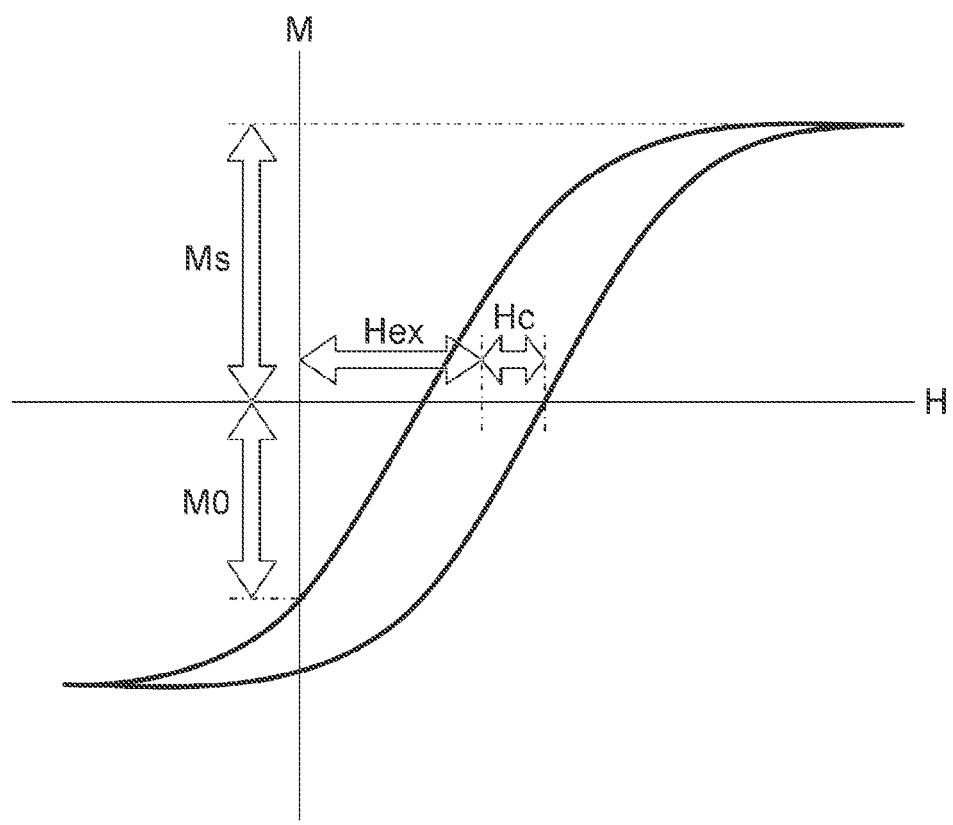
FIG. 1 is a diagram describing a hysteresis loop of a magnetization curve of an exchange coupling film in a position detection element according to the present invention.

FIG. 1 is a diagram describing a hysteresis loop of a magnetization curve of an exchange coupling film of a position detection element according to the present invention. Usually, the hysteresis loop formed by an M-H curve (magnetization curve) of a soft magnetic material has a symmetrical shape about the intersection of the H-axis and the M-axis (magnetic field H=0 A/m, magnetization M=0 A/m). However, as shown in FIG. 1, the hysteresis loop of the exchange coupling film has a shape shifted along the H-axis depending on the magnitude of the exchange coupling magnetic field Hex because the Hex acts on the fixed magnetic layer. In the fixed magnetic layer of the exchange coupling film, the direction of magnetization is hardly reversed, if the Hex is larger, even if an external magnetic field is applied. Accordingly, a change in the magnetization direction from a predetermined direction due to an influence of, for example, the magnetic field of a magnet disposed in the detection object is suppressed to improve the fixed magnetic layer.

When a coercive force Hc that is defined by the difference between the center of the hysteresis loop shifted along the H-axis (the magnetic field intensity at the center corresponds to the exchange coupling magnetic field Hex) and the H-axis intercept of the hysteresis loop is smaller than the exchange coupling magnetic field Hex, even if the fixed magnetic layer of the exchange coupling film is applied with an external magnetic field and is magnetized in a direction along the external magnetic field, when the application of the external magnetic field is completed, the direction of magnetization of the fixed magnetic layer can be aligned by the exchange coupling magnetic field Hex that is relatively stronger than the coercive force Hc. That is, when a relationship between the exchange coupling magnetic field Hex and the coercive force Hc is Hex>Hc, the exchange coupling film has good high-magnetic field resistance. Accordingly, the exchange coupling film is unlikely influenced by a magnetic field, such as an external magnetic field or a magnet disposed in a detection object.

When the above-described relationship between the exchange coupling magnetic field Hex and the coercive force Hc is significant, as shown in FIG. 1, the ratio of residual magnetization M0 to saturated magnetization Ms, M0/Ms, is a negative value. That is, when the M0/Ms ratio is a negative value, the exchange coupling film has better high-magnetic field resistance and has particularly excellent high-magnetic field resistance with an increase in the absolute value of the negative value.

Figure 2:
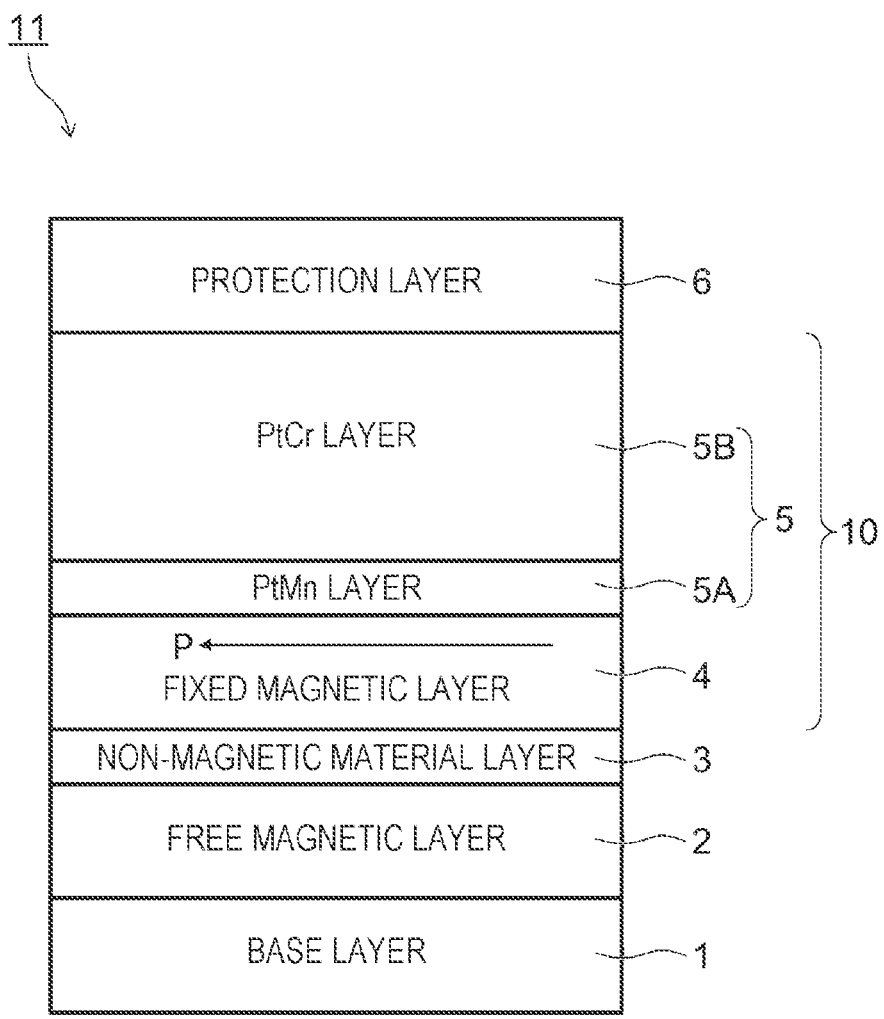
FIG. 2 is an explanatory diagram illustrating a configuration of a position detection element according to a first embodiment of the present invention.

FIG. 2 is an explanatory diagram illustrating a film configuration of a position detection element 11 using an exchange coupling film 10 according to a first embodiment of the present invention. The position detection element 11 is formed by stacking a base layer 1, a free magnetic layer 2, a non-magnetic material layer 3, a fixed magnetic layer 4, a PtMn layer 5A, a PtCr layer 5B, and a protection layer 6 in this order on a surface of a substrate. An antiferromagnetic layer 5 is configured of a stacked structure in which the PtMn layer 5A and the PtCr layer 5B are stacked in this order. The fixed magnetic layer 4 and the antiferromagnetic layer 5 configure an exchange coupling film 10.

Each layer of the position detection element 11 is formed by, for example, a sputtering process or a CVD process. When an alloy layer is formed, a plurality of metals forming the alloy (e.g., in the PtMn layer 5A, Pt and Mn) may be simultaneously supplied, or a plurality of metals forming the alloy may be alternately supplied. An example of the former is simultaneous sputtering of a plurality of metals forming an alloy, and an example of the later is alternate stacking of different metal films. Simultaneous supply of a plurality of metals forming an alloy may be preferred to alternate supply for the purpose of increasing the exchange coupling magnetic field Hex.

The position detection element 11 is a stacked element using a so-called single spin-valve type giant magnetoresistance effect (GMR effect), and the electric resistance changes depending on the relative relationship between the magnetization vector of the free magnetic layer 2 that changes depending on the external magnetic field and the fixed magnetization vector of the fixed magnetic layer 4.

The antiferromagnetic layer 5 is, after the film formation, normalized by annealing treatment and is exchange coupled with the fixed magnetic layer 4 to generate an exchange coupling magnetic field Hex in the fixed magnetic layer 4. As described later, the constituent atoms of each layer constituting the antiferromagnetic layer 5 interdiffuse by annealing treatment. This exchange coupling magnetic field Hex can improve the high-magnetic field resistance of the position detection element 11 including the exchange coupling film 10.

The antiferromagnetic layer 5 of the exchange coupling film 10 according to the present embodiment includes an X(Cr—Mn) layer containing X that is one or more elements selected from the group consisting of platinum group metals and Ni and containing Mn and Cr. The antiferromagnetic layer 5 obtained from the stacked structure shown in FIG. 2 is a Pt(Cr—Mn) layer since the element X is Pt. This Pt(Cr—Mn) layer includes a first region relatively closer to the fixed magnetic layer 4 and a second region relatively farther from the fixed magnetic layer 4, and the content of Mn in the first region is larger than the content of Mn in the second region. The Pt(Cr—Mn) layer having such a structure is formed by subjecting the stacked PtMn layer 5A and PtCr layer 5B to annealing treatment. The structure can be verified by the content distribution of constituent elements in the depth direction (depth profile) obtained by surface analysis while sputtering.

Figure 3:
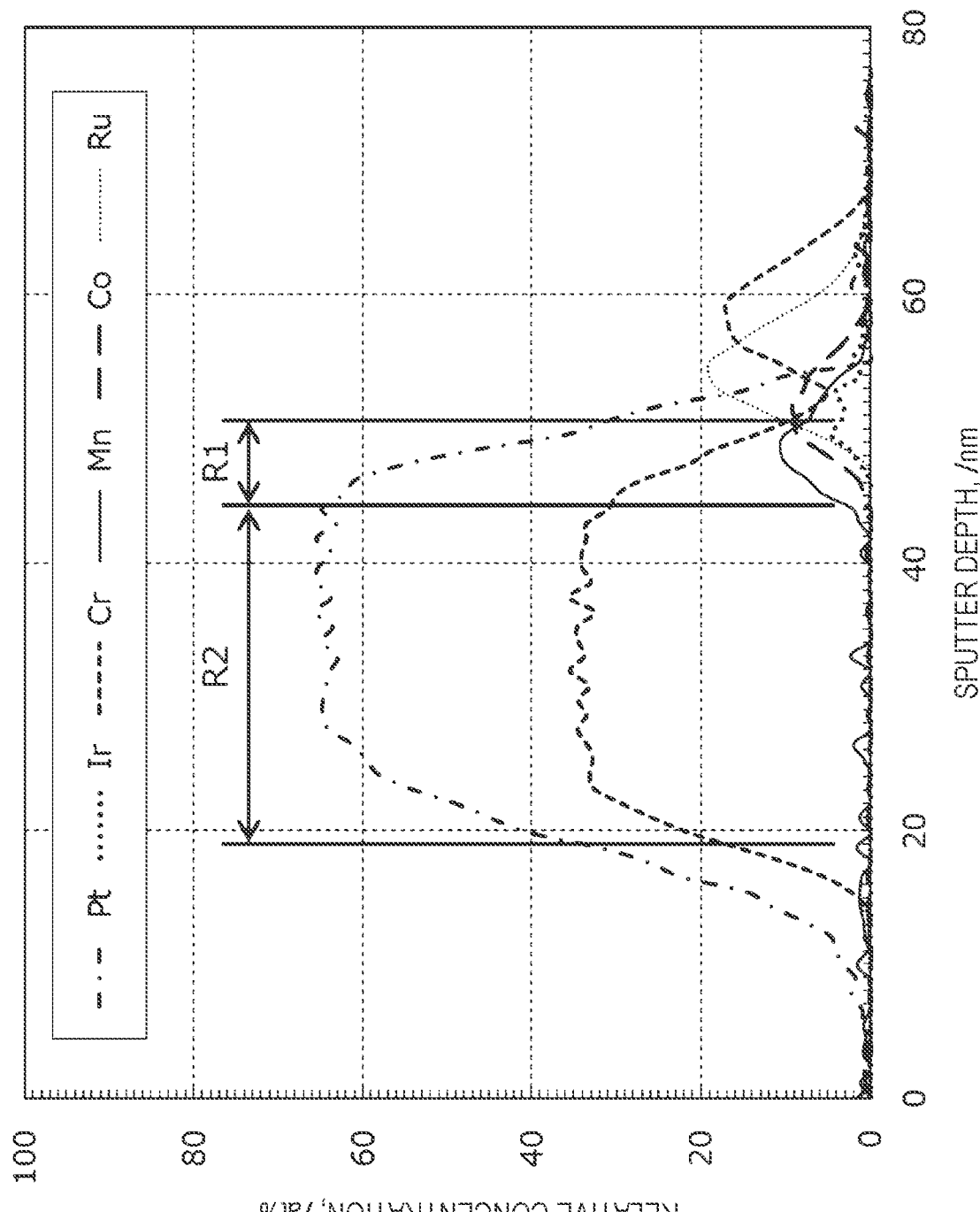
FIG. 3 is an example of a depth profile.

FIG. 3 shows an example of the depth profile of the exchange coupling film 10 according to the present embodiment. The depth profile shown in FIG. 3 is obtained from a film having the following configuration and subjected to annealing treatment in a magnetic field of 15 kOe at 350° C. for 20 hours. Each numerical value in parentheses indicates the film thickness (angstrom).

Substrate/base layer: NiFeCr (40)/non-magnetic material layer: [Cu (40)/Ru (20)]/fixed magnetic layer: $Co_{40at\%}Fe_{60at\%}$ (20)/antiferromagnetic layer [IrMn layer: $Ir_{22at\%}Mn_{78at\%}$ (10)/PtMn layer: $Pt_{50at\%}Mn_{50at\%}$ (16)/PtCr layer: $Pt_{51at\%}Cr_{49at\%}$ (300)]/protection layer: Ta (100)

The depth profile shown in FIG. 3 specifically has content distribution of Pt, Ir, Cr, and Mn in the depth direction obtained by surface analysis with an auger electron spectroscope while performing argon sputtering from the protection layer side. The speed of sputtering with argon was 1.1 nm/min calculated in terms of $SiO_2$.

Figure 4:
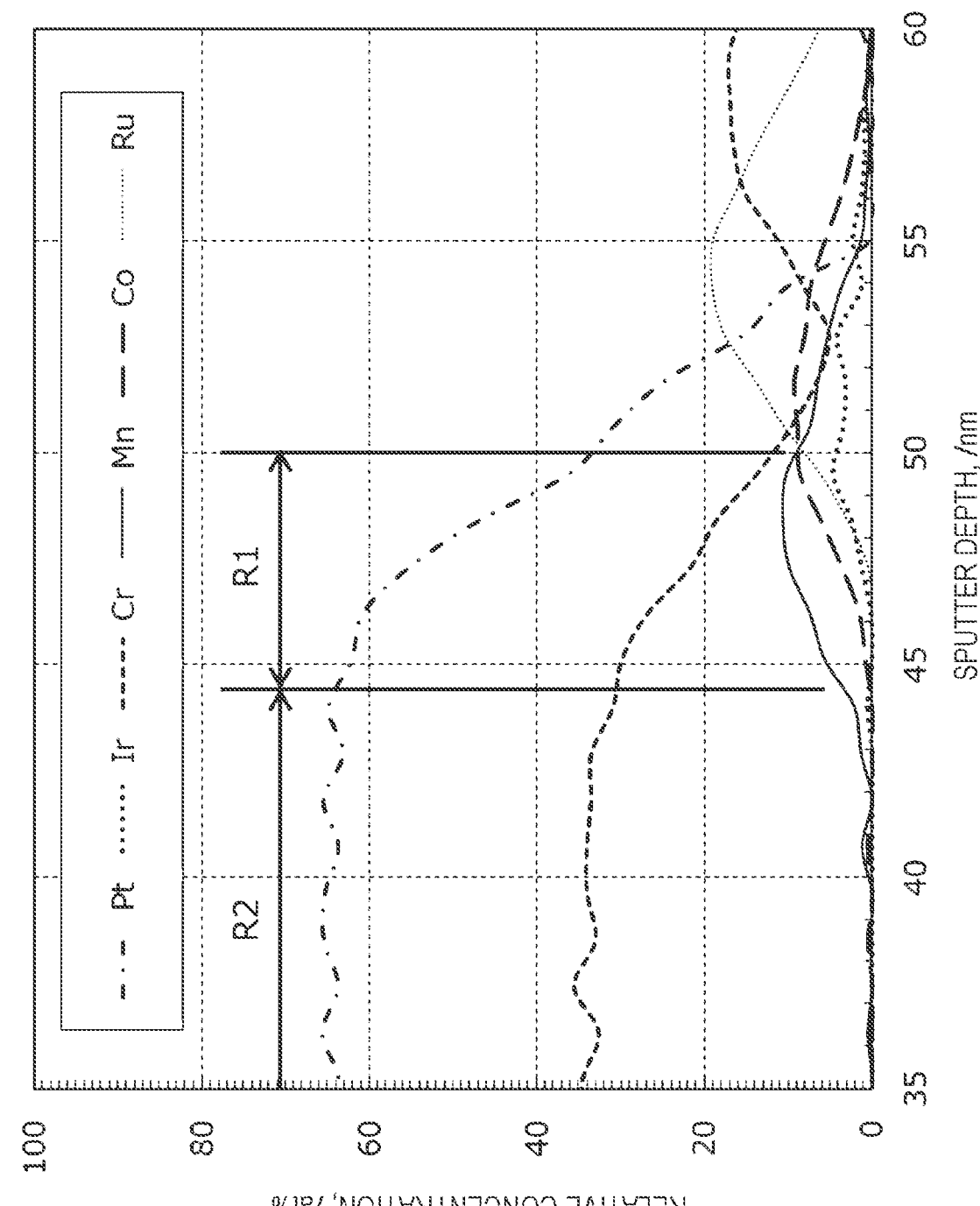
FIG. 4 is an enlarged profile of a part of the depth profile of FIG. 3.

FIG. 4 is an enlarged profile of a part of FIG. 3. In both FIGS. 3 and 4, the content distribution of Co (one of constituent elements of the fixed magnetic layer) and the content distribution of Ru (element constituting the non-magnetic material layer on the antiferromagnetic layer side) are also included in the depth profile for verifying the depth positions of the fixed magnetic layer and the non-magnetic material layer.

As shown in FIG. 3, the antiferromagnetic layer has a thickness of about 30 nm and includes an X(Cr—Mn) layer containing Pt and Ir as the X that is one or more elements selected from the group consisting of platinum group metals and Ni and containing Mn and Cr. Specifically, the antiferromagnetic layer is composed of a (Pt—Ir) (Cr—Mn) layer. The X(Cr—Mn) layer (i.e., (Pt—Ir) (Cr—Mn) layer) includes a first region R1 relatively closer to the fixed magnetic layer and a second region R2 relatively farther from the fixed magnetic layer, and the content of Mn in the first region R1 is larger than the content of Mn in the second region R2. Such a structure can be obtained by forming a multilayer structure by appropriately stacking layers, such as a layer of XCr and a layer of XMn, and subjecting the multilayer structure to annealing treatment as described above.

Figure 5:
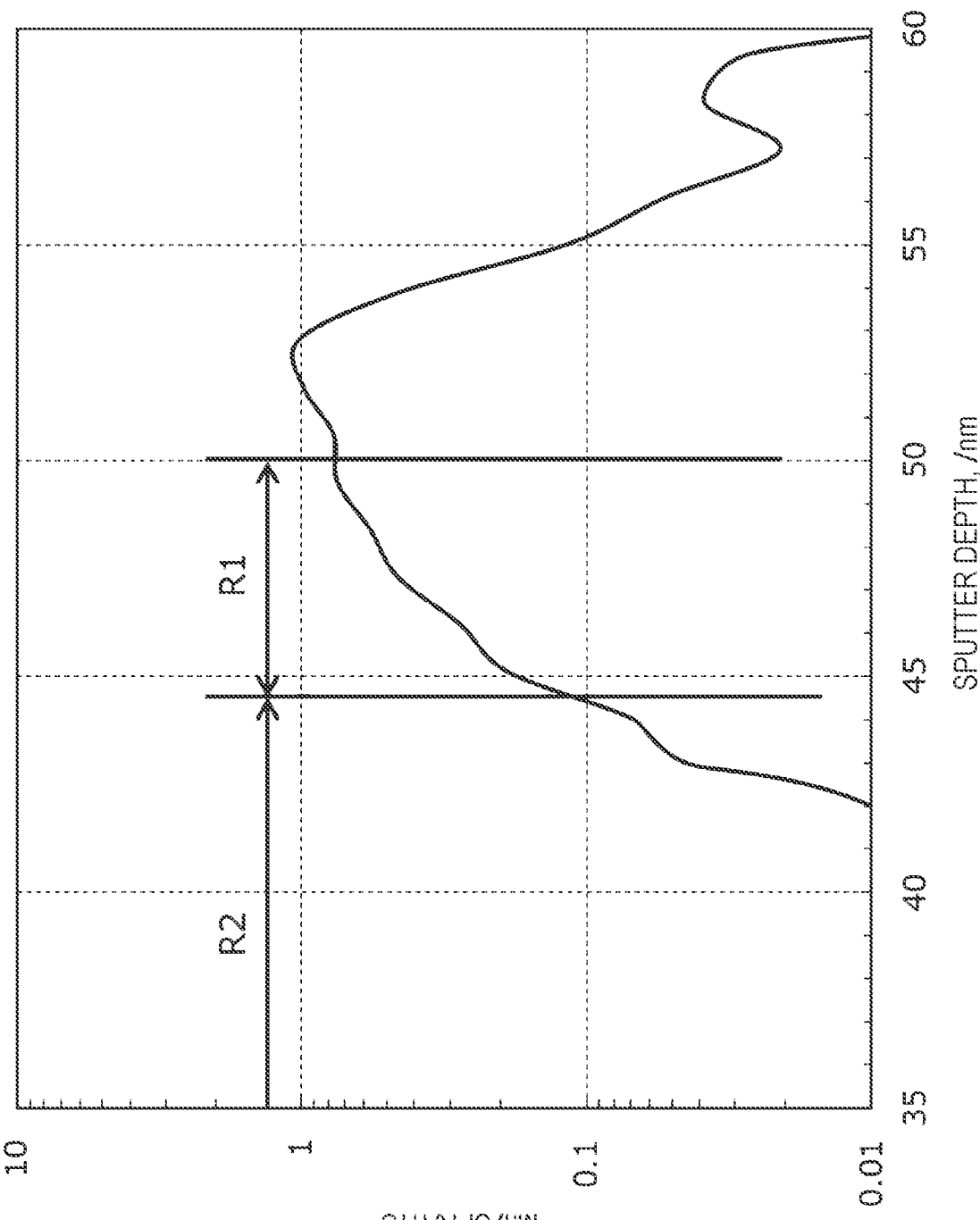
FIG. 5 is a graph showing the ratio of the content of Mn to the content of Cr, (Mn/Cr ratio), determined based on FIG. 4 with the same range of the horizontal axis as that in FIG. 4.

FIG. 5 is a graph showing the ratio of the content of Mn to the content of Cr, (Mn/Cr ratio), calculated based on the content of Mn and the content of Cr at each depth determined by the depth profile with the same range of the horizontal axis as that in FIG. 4. Based on the results shown in FIG. 5, in the present specification, the depth at which the Mn/Cr ratio is 0.1 is defined as the boundary between the first region R1 and the second region R2. That is, in the antiferromagnetic layer, the region closer to the fixed magnetic layer and having an Mn/Cr ratio of 0.1 or more is defined as the first region R1, and the region other than the first region R1 in the antiferromagnetic layer is defined as the second region R2. Based on this definition, in the depth profile shown in FIG. 3, the boundary between the first region R1 and the second region R2 lies at a depth of about 44.5 nm.

Not only a large Mn/Cr ratio influences the magnitude of the exchange coupling magnetic field Hex, but also with an increase in the Mn/Cr ratio, the value of Hex/Hc tends to easily become a positive value with a large absolute value. Specifically, the first region R1 preferably includes a portion having an Mn/Cr ratio of 0.3 or more, more preferably a portion having an Mn/Cr ratio of 0.7 or more, and particularly preferably a portion having an Mn/Cr ratio of 1 or more.

Since a relatively large amount of Mn is thus contained in the first region R1, the position detection element 11 according to the present embodiment can generate a high exchange coupling magnetic field Hex. In contrast, the content of Mn in the second region R2 is low, and the content of Cr is relatively high. Accordingly, the antiferromagnetic layer 5 has a high blocking temperature Tb. Consequently, even if the fixed magnetic layer 4 according to the present embodiment is placed in a high temperature environment, the magnetization direction of the fixed magnetic layer 4 hardly changes from a predetermined direction. In the description above, the $X^0Mn$ layer (where, $X^0$ is one or more elements selected from the group consisting of platinum group metals and Ni) that is stacked on the PtCr layer on the fixed magnetic layer 4 side is a PtMn layer 5A but is not limited thereto.

Figure 6:
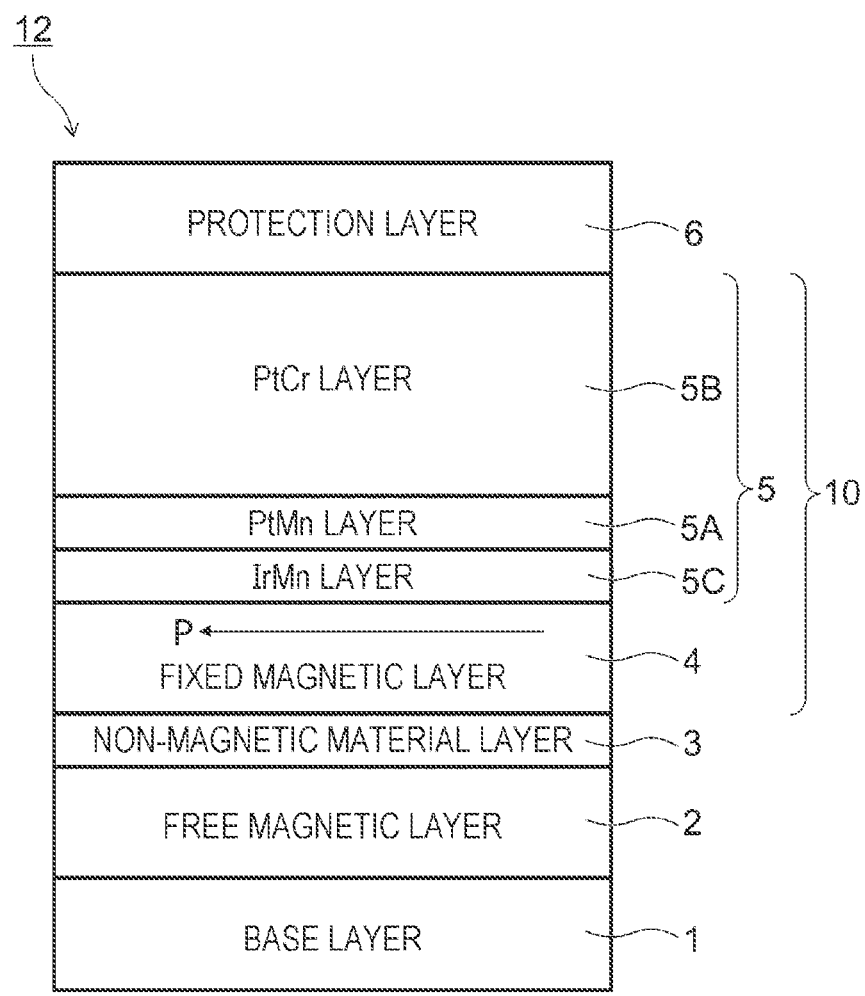
FIG. 6 is an explanatory diagram illustrating a configuration of a position detection element according to a modification of the first embodiment of the present invention.

FIG. 6 is an explanatory diagram illustrating a configuration of a position detection element according to a modification of the first embodiment of the present invention. As shown therein, an IrMn layer 5C may be further stacked at a position closer to the fixed magnetic layer 4 than the PtMn layer 5A of the antiferromagnetic layer 5. In such a case, the $X^0Mn$ layer is composed of the PtMn layer 5A and the IrMn layer 5C.

When the antiferromagnetic layer has a stacked structure composed of an IrMn layer 5C, a PtMn layer 5A, and a PtCr layer 5B, the ratio of the residual magnetization M0 to the saturated magnetization Ms, (M0/Ms), is a negative value, and the absolute value thereof easily becomes large. On this occasion, the whole hysteresis loop of the exchange coupling film 10 shifts to the direction of magnetization of the exchange coupling magnetic field, and the coercive force Hc is decreased. As a result, the resulting exchange coupling film 10 has not only a large Hex but also excellent high-magnetic field resistance.

From the viewpoint that the exchange coupling film 10 has excellent high-magnetic field resistance, the M0/Ms ratio is preferably −0.05 or less, more preferably −0.10 or less, further preferably −0.15 or less, and particularly preferably −0.20 or less.

From the viewpoint of enhancing the high-magnetic field resistance of the exchange coupling film 10, it may be preferable that the PtMn layer 5A has a thickness of 12 angstrom or more, and when an IrMn layer C is included as the $X^0Mn$ layer, it may be preferable that the thickness is 6 angstrom or more, and it may be preferable that the total sum of the thickness of the PtMn layer 5A and the thickness of the IrMn layer C is 20 angstrom or more. When at least one of these conditions is satisfied, it becomes significant that the M0/Ms ratio tends to be a negative value with an absolute value.

The fixed magnetic layer 4 is formed of a CoFe alloy (cobalt-iron alloy). The coercive force of the CoFe alloy is increased by increasing the Fe content ratio. The fixed magnetic layer 4 is a layer that contributes to spin-valve type giant magnetoresistance effect, and the direction in which the fixed magnetization direction P of the fixed magnetic layer 4 extends is the direction of the sensitive axis of the position detection element 11. From the viewpoint of enhancing the high-magnetic field resistance of the exchange coupling film 10, it may be preferable that the fixed magnetic layer 4 has a thickness of 12 angstrom or more and 30 angstrom or less.

The base layer 1 and the protection layer 6 are constituted of, for example, tantalum (Ta). Although the free magnetic layer 2 may be formed of any material and may have any structure, for example, a CoFe alloy (cobalt-iron alloy) or a NiFe alloy (nickel-iron alloy) can be used as the material, and it can be formed as, for example, a single layer structure, a stacked structure, or a laminated ferri-structure. The non-magnetic material layer 3 can be formed of, for example, Cu (copper).

In the antiferromagnetic layer 5 of the position detection element 11 according to the present embodiment (see FIG. 2), the PtMn layer 5A is stacked so as to be in contact with the fixed magnetic layer 4, and the PtCr layer 5B is stacked on the PtMn layer 5A. The PtMn layer 5A is an example of the $X^0Mn$ layer (where, $X^0$ is one or more elements selected from the group consisting of platinum group metals and Ni). That is, the aspect shown is a position detection element 11 in which the $X^0Mn$ layer has a single layer structure and $X^0$ is Pt. The $X^0$ may be an element other than Pt, or the $X^0Mn$ layer may be composed of a plurality of layers. Examples of such an $X^0Mn$ layer include that the $X^0Mn$ layer is an IrMn layer and that as the position detection element 12 shown in FIG. 6, an IrMn layer and a PtMn layer are stacked in this order from the side closer to the fixed magnetic layer 4. In another example, a PtMn layer, an IrMn layer, and a PtMn layer are stacked in this order from the side closer to the fixed magnetic layer 4.

Although the position detection elements 11 and 12 according to the present embodiment have a structure in which the antiferromagnetic layer 5 is stacked on the fixed magnetic layer 4, the order of stacking may be reverse to have a structure in which the fixed magnetic layer 4 is stacked on the antiferromagnetic layer 5.

Position Detection Element According to Second Embodiment

Figure 7:
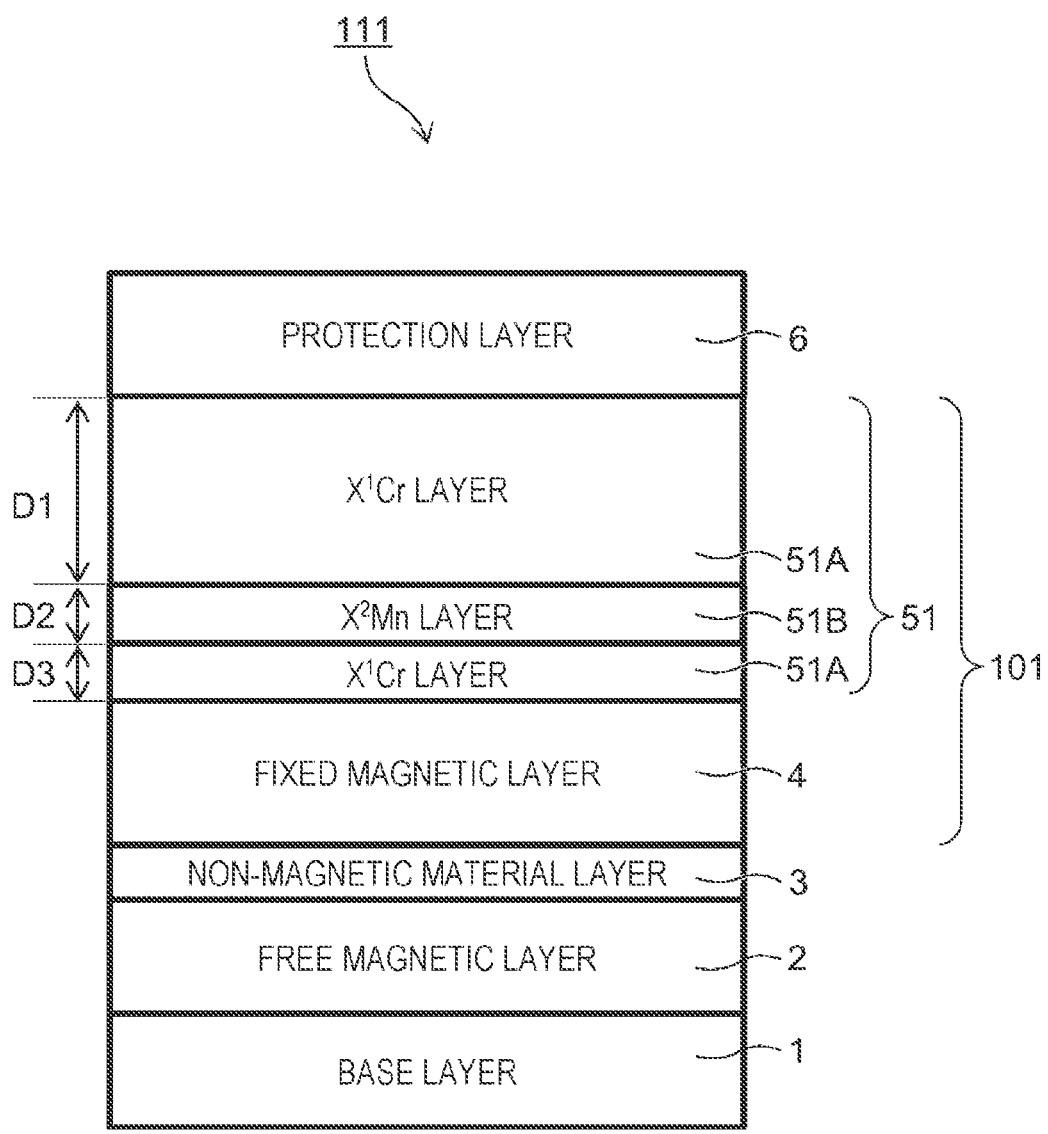
FIG. 7 is an explanatory diagram illustrating a configuration of a position detection element according to a second embodiment of the present invention.

FIG. 7 is an explanatory diagram conceptionally illustrating a structure of a position detection element according to a second embodiment of the present invention. In this embodiment, the layers having the same functions as those in the position detection element 11 shown in FIG. 2 are designated by the same reference numerals, and description thereof is omitted.

The position detection element 111 according to the second embodiment has a basic structure common to the position detection element 11 according to the first embodiment such as that a fixed magnetic layer 4 and an antiferromagnetic layer 51 constitute an exchange coupling film 101, but the structure of the antiferromagnetic layer 51 is different from that of the antiferromagnetic layer 5 of the position detection element 11.

The antiferromagnetic layer 51 has an alternately stacked structure composed of three layers in which an $X^1$Cr layer 51A and an $X^2$Mn layer 51B are alternately stacked (where, $X^1$ and $X^2$ are each one or more elements selected from the group consisting of platinum group metals and Ni, and $X^1$ and $X^2$ may be the same or different). These layers are each formed by, for example, a sputtering process or a CVD process. The antiferromagnetic layer 51 is, after the film formation, normalized by annealing treatment and is exchange coupled with the fixed magnetic layer 4 to generate an exchange coupling magnetic field Hex in the fixed magnetic layer 4. This exchange coupling magnetic field Hex can improve the high-magnetic field resistance of the position detection element 111 including the exchange coupling film 101.

FIG. 7 shows, as an aspect of an alternately stacked structure composed of three or more layers in which an $X^1$Cr layer 51A and an $X^2$Mn layer 51B are alternately stacked, an antiferromagnetic layer 51 having a three-layer structure consisting of $X^1$Cr layer 51A/$X^2$Mn layer 51B/$X^1$Cr layer 51A in which an $X^1$Cr layer 51A is in contact with the fixed magnetic layer 4. However, the $X^1$Cr layer 51A and the $X^2$Mn layer 51B may be replaced with each other, that is, the antiferromagnetic layer 51 may have a three-layer structure consisting of $X^2$Mn layer 51B/$X^1$Cr layer 51A/$X^2$Mn layer 51B. In this three-layer structure, an $X^2$Mn layer 51B is in contact with the fixed magnetic layer 4. An aspect in which the number of layers related to the antiferromagnetic layer 51 is four or more will be described later.

When an $X^1$Cr layer 51A is most closer to the fixed magnetic layer 4, the thickness D1 of the $X^1$Cr layer 51A on the protection layer 6 side is preferably larger than the thickness D3 of the $X^1$Cr layer 51A in contact with the fixed magnetic layer 4 from the viewpoint of increasing the exchange coupling magnetic field Hex. In addition, the thickness D1 of the $X^1$Cr layer 51A of the antiferromagnetic layer 51 is preferably larger than the thickness D2 of the $X^2$Mn layer 51B. The ratio of the thickness D1 and the thickness D2, (D1:D2), is more preferably 5:1 to 100:1 and further preferably 10:1 to 50:1. The ratio of the thickness D1 and the thickness D3, (D1:D3), is more preferably 5:1 to 100:1 and further preferably 10:1 to 50:1.

Incidentally, in a three-layer structure consisting of $X^2$Mn layer 51B/$X^1$Cr layer 51A/$X^2$Mn layer 51B in which an $X^2$Mn layer 51B is most closer to the fixed magnetic layer 4, the thickness D3 of the $X^2$Mn layer 51B most closer to the fixed magnetic layer 4 may be the same as the thickness D1 of the $X^2$Mn layer 51B on the protection layer 6 side.

From the viewpoint of increasing the exchange coupling magnetic field Hex, the $X^1$ in the $X^1$Cr layer 51A is preferably Pt, the $X^2$ in the $X^2$Mn layer 51B is preferably Pt or Ir and more preferably Pt. When the $X^1$Cr layer 51A is a PtCr layer, the PtCr is preferably $Pt_XCr_{100-X}$ (X is 45 at % or more and 62 at % or less) and more preferably $Pt_XCr_{100-X}$ (X is 50 at % or more and 57 at % or less). From the same viewpoint, the $X^2$Mn layer 51B is preferably a PtMn layer.

Figure 8:
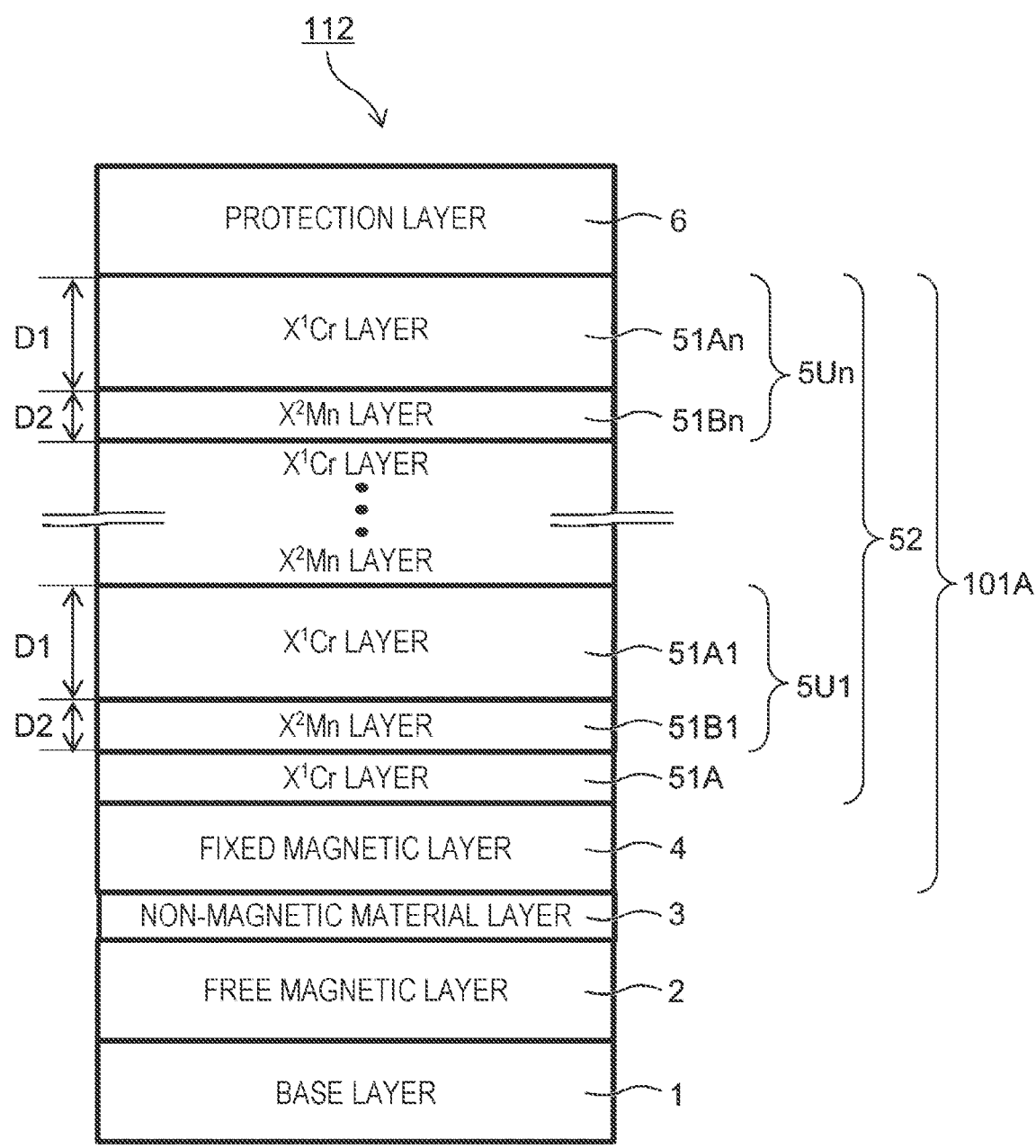
FIG. 8 is an explanatory diagram illustrating a configuration of a position detection element according to a modification of the second embodiment of the present invention.

FIG. 8 shows an explanatory diagram illustrating a film configuration of a position detection element 112 according to a modification of the second embodiment of the present invention. In this example, the layers having the same functions as those in the position detection element 111 shown in FIG. 7 are designated by the same reference numerals, and description thereof is omitted. In the position detection element 112, a fixed magnetic layer 4 and an antiferromagnetic layer 51 constitute an exchange coupling film 101A.

The position detection element 112 shown in FIG. 8 differs from the position detection element 111 shown in FIG. 7 in that the antiferromagnetic layer 52 is composed of four or more layers and includes a unit stacking part in which a plurality of units each composed of the $X^1$Cr layer 51A and the $X^2$Mn layer 51B (see FIG. 7) are stacked. In FIG. 8, the antiferromagnetic layer 52 includes a unit stacking part 5U1-5Un (n is an integer of 2 or more) composed of n units each consisting of an $X^1$Cr layer and an $X^2$Mn layer, from a unit 5U1 consisting of an $X^1$Cr layer 51A1 and an $X^2$Mn layer 51B1 to a unit 5Un consisting of an $X^1$Cr layer 51An and an $X^2$Mn layer 51Bn, are stacked.

In the unit stacking part 5U1-5Un, the $X^1$Cr layer 51A1, . . . and the $X^1$Cr layer 51An have the same thickness D1, and the $X^2$Mn layer 51B1, . . . and the $X^2$Mn layer 51Bn likewise have the same thickness D2. When a stacked structure prepared by stacking units 5U1 to 5Un having the same configuration is subjected to annealing treatment, it is possible to generate a high exchange coupling magnetic field Hex and a high coercive force Hc in the fixed magnetic layer 4 of the exchange coupling film 101A and to enhance the high-temperature stability of the antiferromagnetic layer 52.

Incidentally, the antiferromagnetic layer 52 in FIG. 8 is composed of the unit stacking part 5U1-5Un and an $X^1$Cr layer 51A, and the $X^1$Cr layer 51A is in contact with the fixed magnetic layer 4. However, the antiferromagnetic layer 52 may be composed of the unit stacking part 5U1-5Un and an $X^2$Mn layer 51B, and the $X^2$Mn layer 51B may be in contact with the fixed magnetic layer 4. In the later, the order of stacking layers in each unit adjacent to the $X^2$Mn layer 51B being in contact with the fixed magnetic layer 4 is reverse to that in FIG. 8, that is, the order of stacking layers is, from the fixed magnetic layer 4 side, $X^1$Cr layer 51A1/$X^2$Mn layer 51B1/ . . . /$X^1$Cr layer 51An/$X^2$Mn layer 51Bn. Alternatively, the antiferromagnetic layer 52 may be composed of the unit stacking part 5U1-5Un only. In an antiferromagnetic layer 52 formed from a stacked structure composed of the unit stacking part 5U1-5Un only, it is determined which of the $X^2$Mn layer 51B1 and the $X^1$Cr layer 51A1 is in contact with the fixed magnetic layer 4 by the stacking order in each unit.

The number of stacked layers of the unit stacking part 5U1-5Un can be set according to the size of the antiferromagnetic layer 52, the thickness D1, and the thickness D2. For example, the thickness D2 is 5 to 15 angstrom and the thickness D1 is 30 to 40 angstroms, the number of stacked layers is preferably 3 to 15 and more preferably 5 to 12 for increasing the exchange coupling magnetic field Hex in a high temperature environment.

As examples of the position detection element 11 of the present embodiment, the following exchange coupling films (A) and (B) were each prepared by forming a stacked structure having the following configuration and subjecting it to annealing treatment under the conditions of a temperature of 350° C. and a magnetic field strength of 15 kOe for 20 hours to fix the magnetization of the fixed magnetic layer 4 and the antiferromagnetic layer 5. Each numerical value in parentheses indicates the film thickness (angstrom).

Exchange Coupling Film (A)

Substrate/base layer 1: NiFeCr (40)/non-magnetic material layer 3 [Cu (40)/Ru (10)]/fixed magnetic layer 4: $Co_{60at\%}Fe_{40at\%}$ (20)/antiferromagnetic layer 5: unit stacking part 5U1-5U7: [stacked 7 layers each consisting of $Pt_{48at\%}Mn_{52at\%}$ (6)/$Pt_{51at\%}Cr_{49at\%}$ (34)]/protection layer 6: [Ta (90)/Ru (20)]

Exchange Coupling Film (B)

A stacked structure in which the antiferromagnetic layer 5 of the exchange coupling film (A) is changed to the following configuration was formed.

$X^1Cr$ layer 51A: $Pt_{51at\%}Cr_{49at\%}$ (6)/unit stacking part 5U1-5U7: [stacked 7 layers each consisting of $Pt_{48at\%}Mn_{52at\%}$ (6)/$Pt_{51at\%}Cr_{49at\%}$ (34)]

Regarding the exchange coupling film (B), content distribution of Pt, Cr, and Mn in the depth direction (depth profile) was obtained by surface analysis (measurement area: 71 µm×71 µm) with an auger electron spectroscope while performing argon sputtering from the protection layer 6 side. The speed of sputtering with argon was 1.0 nm/min calculated in terms of $SiO_2$.

Figure 20:
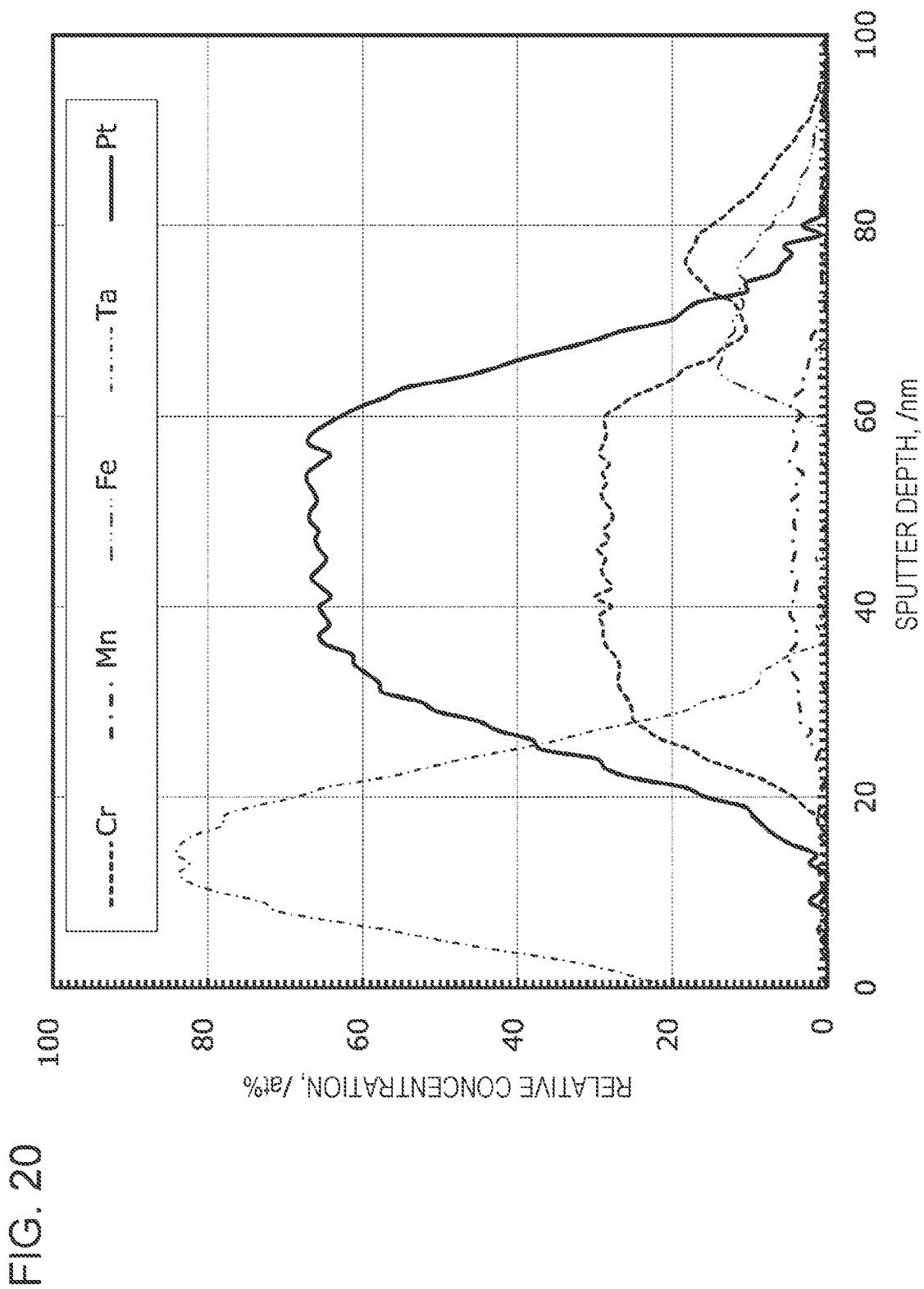
FIG. 20 is a depth profile of exchange coupling film (B)

FIG. 20 is the depth profile of the exchange coupling film (B). In order to verify the depth positions of the fixed magnetic layer 4 and the non-magnetic material layer 3, Fe (one of constituent elements of the fixed magnetic layer 4) and Ta (element constituting the protection layer 6 on the antiferromagnetic layer 5 side) are also included in the depth profile. As shown in FIG. 20, in the depth profile of the exchange coupling film (B), a depth range reflecting only the composition of the antiferromagnetic layer 5 without substantially influenced by the fixed magnetic layer 4 and the protection layer 6 was recognized in a range from a depth of about 35 nm to a depth of about 55 nm. The contents of Pt, Cr, and Mn were measured as averages in this depth range. The results thereof were as follows.

Pt: 65.5 at %
Cr: 28.5 at %
Mn: 4.2 at %

This result demonstrates that the content of Pt in the antiferromagnetic layer 5 is 30 at % or more. Accordingly, it is inferred that the antiferromagnetic layer 5 has a face-centered cubic lattice (fcc) structure.

In addition, the ratio of the content of Mn to the content of Cr (Mn/Cr ratio) determined based on the results above was 0.15. The depth range above is a portion corresponding to the unit stacking part in which seven units each consisting of $Pt_{48at\%}Mn_{52at\%}$ (6)/$Pt_{51at\%}Cr_{49at\%}$ (34) are stacked. The calculated contents of Pt, Cr, and Mn in the unit consisting of $Pt_{48at\%}Mn_{52at\%}$ (6)/$Pt_{51at\%}Cr_{49at\%}$ (34) were as follows:

Pt: 50.6 at %,
Cr: 41.7 at %, and
Mn: 7.8 at %.

The Mn/Cr ratio based on these contents was 0.19. Considering the difference in ease of movement of each element (Pt, Cr, and Mn) during the annealing treatment and the measurement accuracy of the depth profile, it can be judged that the measured Mn/Cr ratio is substantially close to the value designed when the stacked structure is formed.

Figure 21:
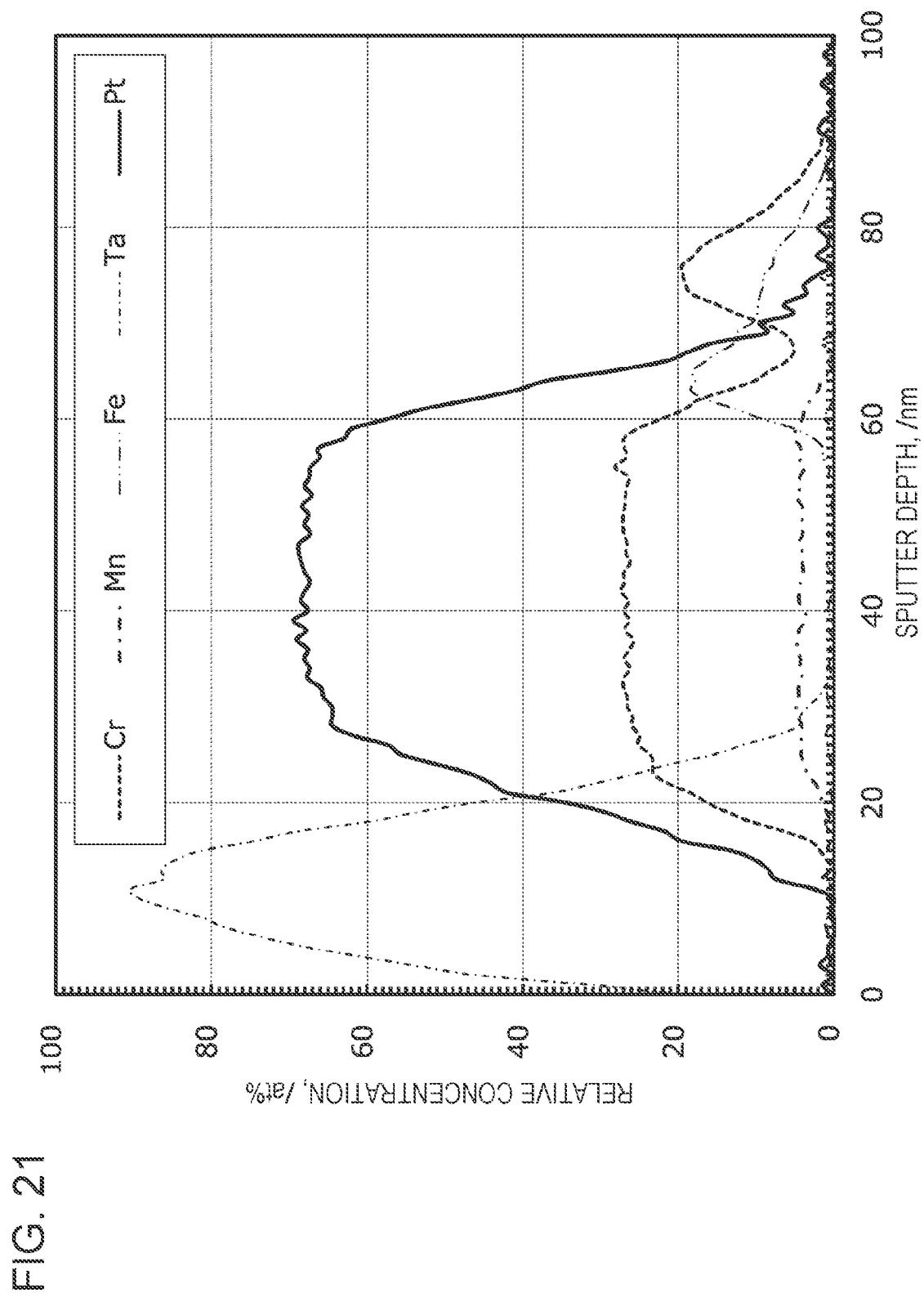
FIG. 21 is a depth profile of a stacked structure (before annealing treatment) prior to formation into an exchange coupling film (B) by annealing treatment.

For confirmation, the depth profile of a stacked structure (not subjected to annealing treatment) giving the exchange coupling film (B) was similarly determined. The results are shown in FIG. 21. As shown in FIG. 21, the depth profile obtained by surface analysis with an auger electron spectroscope while performing argon sputtering did not give a result in which the content of Mn and the content of Cr change depending on the repetition of the unit in the unit stacking part composed of layers of stacked 7 units. That is, it was confirmed that the resolution of this depth profile does not reach 4 nm.

Accordingly, a region of 100 µm×100 µm is irradiated with $Bi^+$ ions as primary ions to detect secondary ions by time-on-flight secondary ion mass spectrometry (TOF-SIMS), and the depth profile was obtained using an $O^{2+}$ ion as the milling ion. The average milling rate was about 1.5 angstrom/sec.

As ions related to Mn, 7 types of ions, such as $Mn^+$ and $MnO^+$, were detected, and as ions related to Cr, 8 types of ions, such as $Cr^+$ and $CrO^+$, were detected. Among these ions, the detection sensitivity for $Cr^+$ is too high, and quantitative evaluation of $Cr^+$ was impossible. Incidentally, the detection sensitivity for $Pt^+$ is too low, and quantitative evaluation thereof was impossible. Accordingly, the depth profile of the total sum of detected intensities of 7 types of ions related to Mn and the depth profile of the total sum of detected intensities of 7 types of ions related to Cr (that is, 7 types of ions excluding $Cr^+$ from 8 types of ions to be measured related to Cr) are determined, and based on these results, the detected intensity ratio ("total sum of detected intensities of 7 types of ions related to Mn"/"total sum of detected intensities of 7 types of ions related to Cr") at each depth was defined as "I—Mn/Cr" to determine the depth profile. Incidentally, in the present specification, the I—Mn/Cr is also referred to as "first intensity ratio".

Figure 22A:
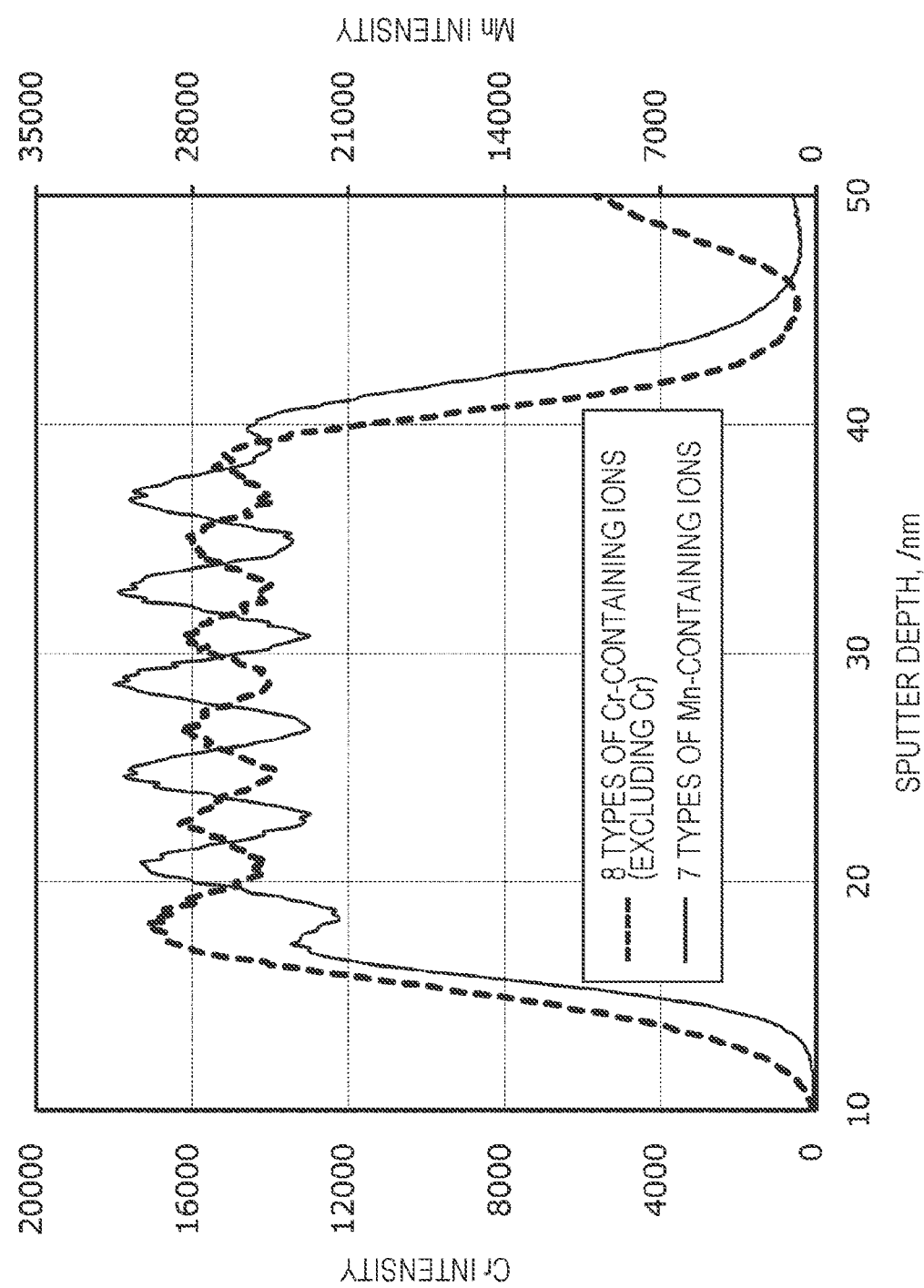
FIG. 22A is depth profiles of the total sum of detected intensities of 7 types of ions related to Mn and the total sum of detected intensities of 7 types of ions related to Cr of a stacked structure (before annealing treatment) prior to formation into an exchange coupling film (A) by annealing treatment.
Figure 22B:
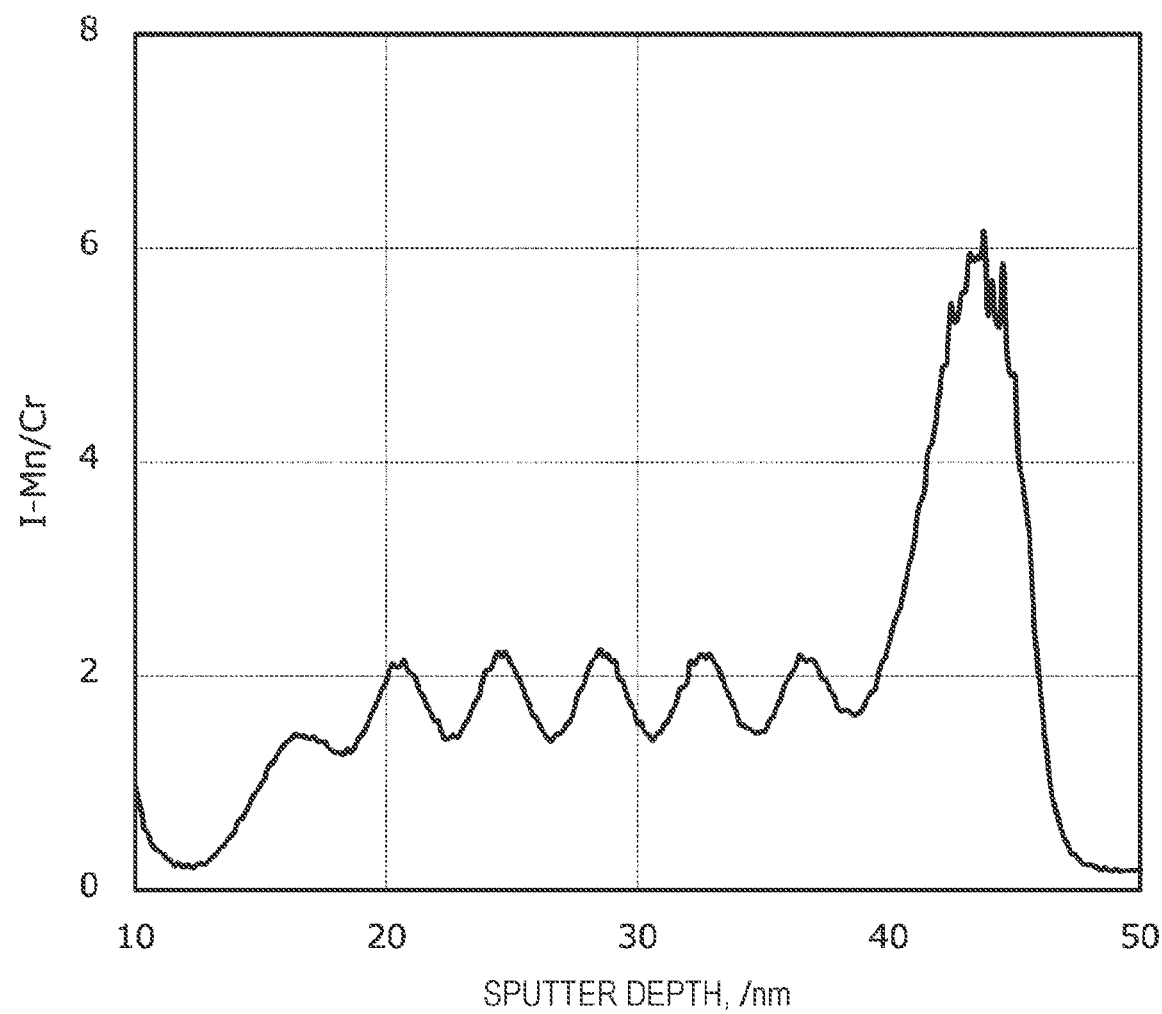
FIG. 22B is a depth profile of I—Mn/Cr (first intensity ratio) of the stacked structure (before annealing treatment)

FIGS. 22A and 22B show the measurement results of these depth profiles for stacked structure before being formed into the exchange coupling film (A) by annealing treatment. In addition, FIGS. 23A and 23B show the measurement results for the exchange coupling film (A) obtained by annealing treatment.

As shown in FIG. 22A, a change of the Mn intensity and a change of the Cr intensity based on the configuration of the unit stacking part (alternately stacked structure) were confirmed in the depth profiles by using TOF-SIMS. In the I—Mn/Cr depth profile shown in FIG. 22B based on these results, a change of I—Mn/Cr corresponding to the stacking of each unit in the unit stacking part was observed, and a region having I—Mn/Cr relatively higher than that in other region was observed on the side closer to the fixed magnetic layer 4.

This tendency was also observed in an exchange coupling film obtained by normalization by annealing treatment.

Figure 23A:
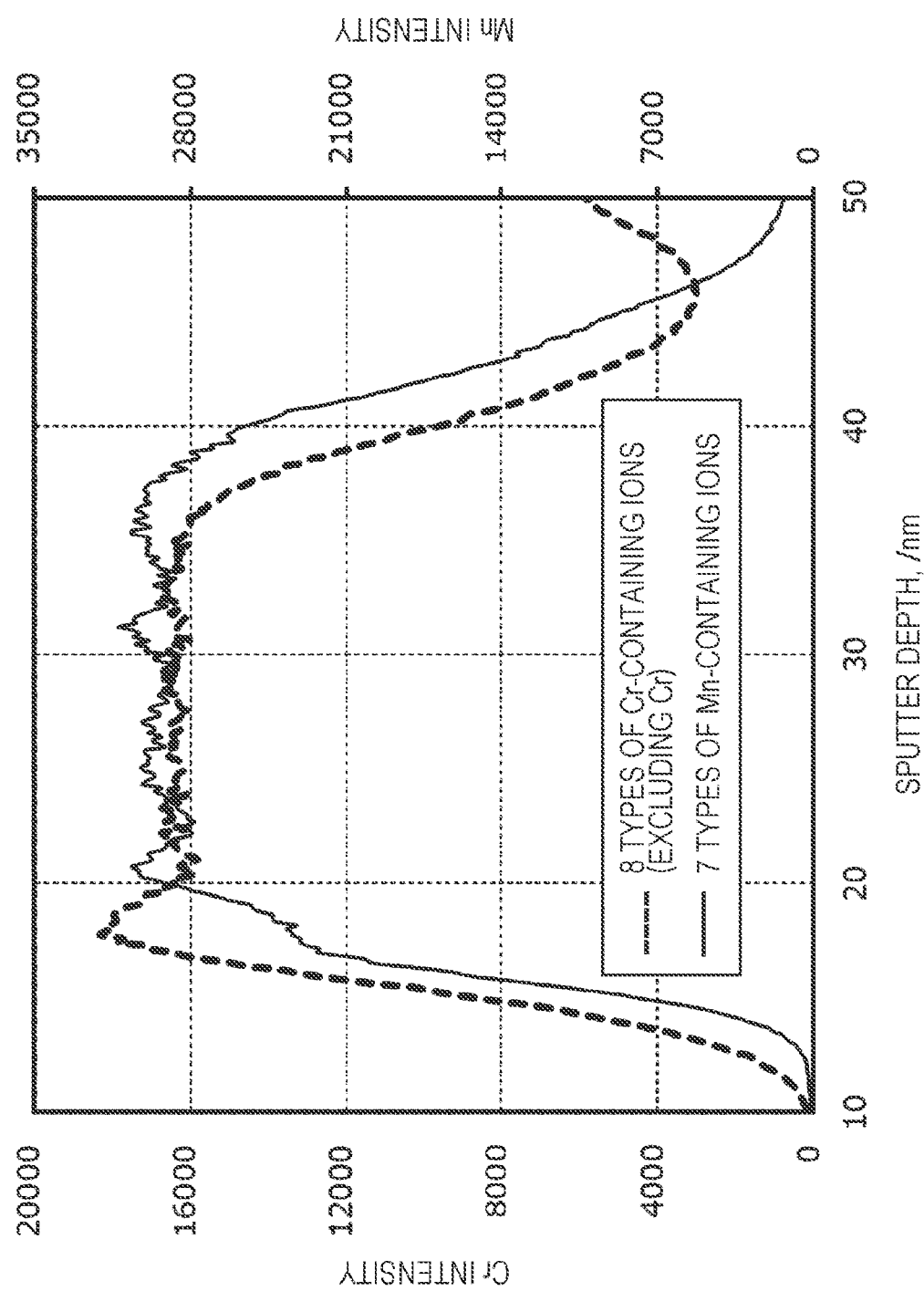
FIG. 23A is depth profiles of the total sum of detected intensities of 7 types of ions related to Mn and the total sum of detected intensities of 7 types of ions related to Cr of an exchange coupling film (A)
Figure 24A:
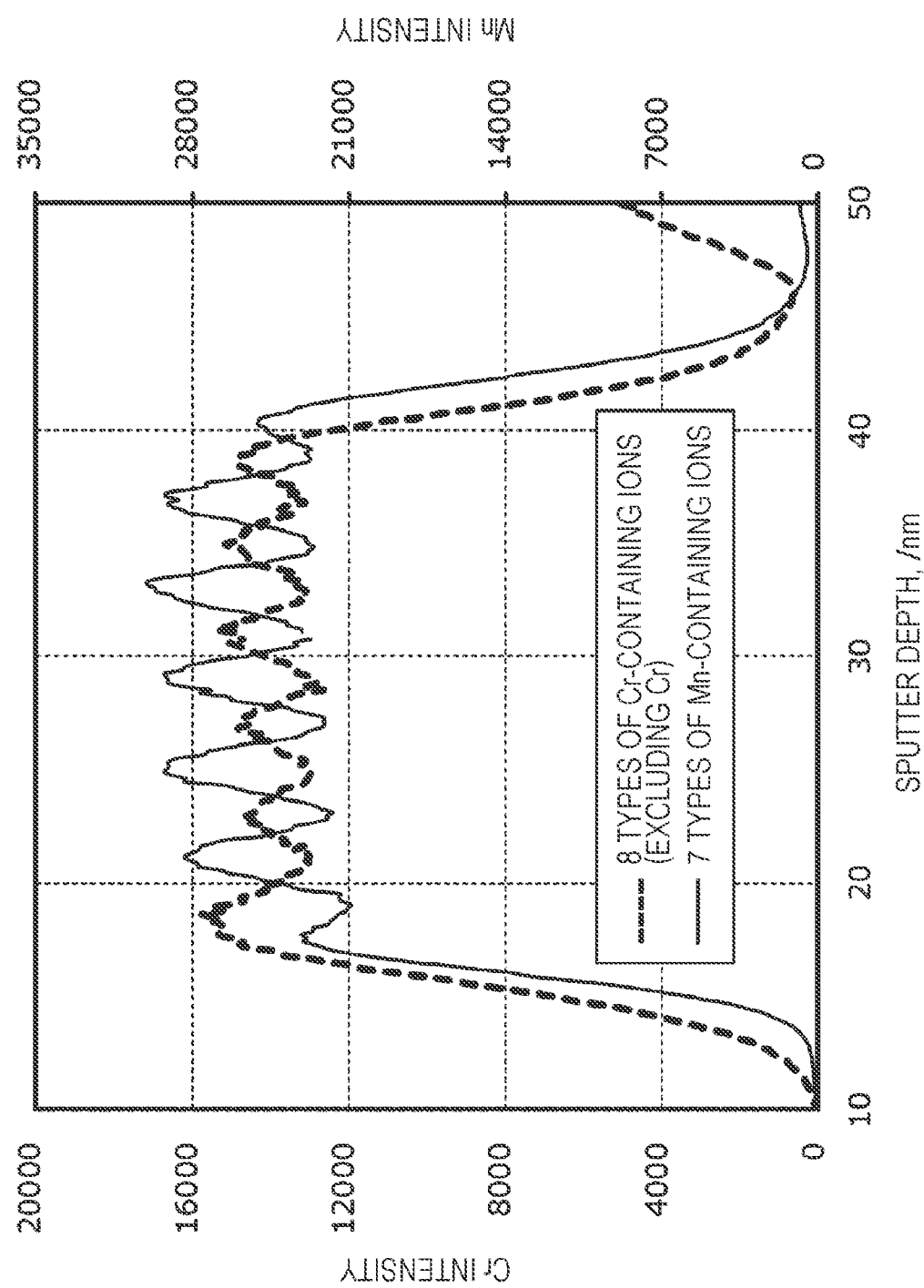
FIG. 24A is depth profiles of the total sum of detected intensities of 7 types of ions related to Mn and the total sum of detected intensities of 7 types of ions related to Cr of a stacked structure (before annealing treatment) prior to formation into an exchange coupling film (B) by annealing treatment.
Figure 24B:
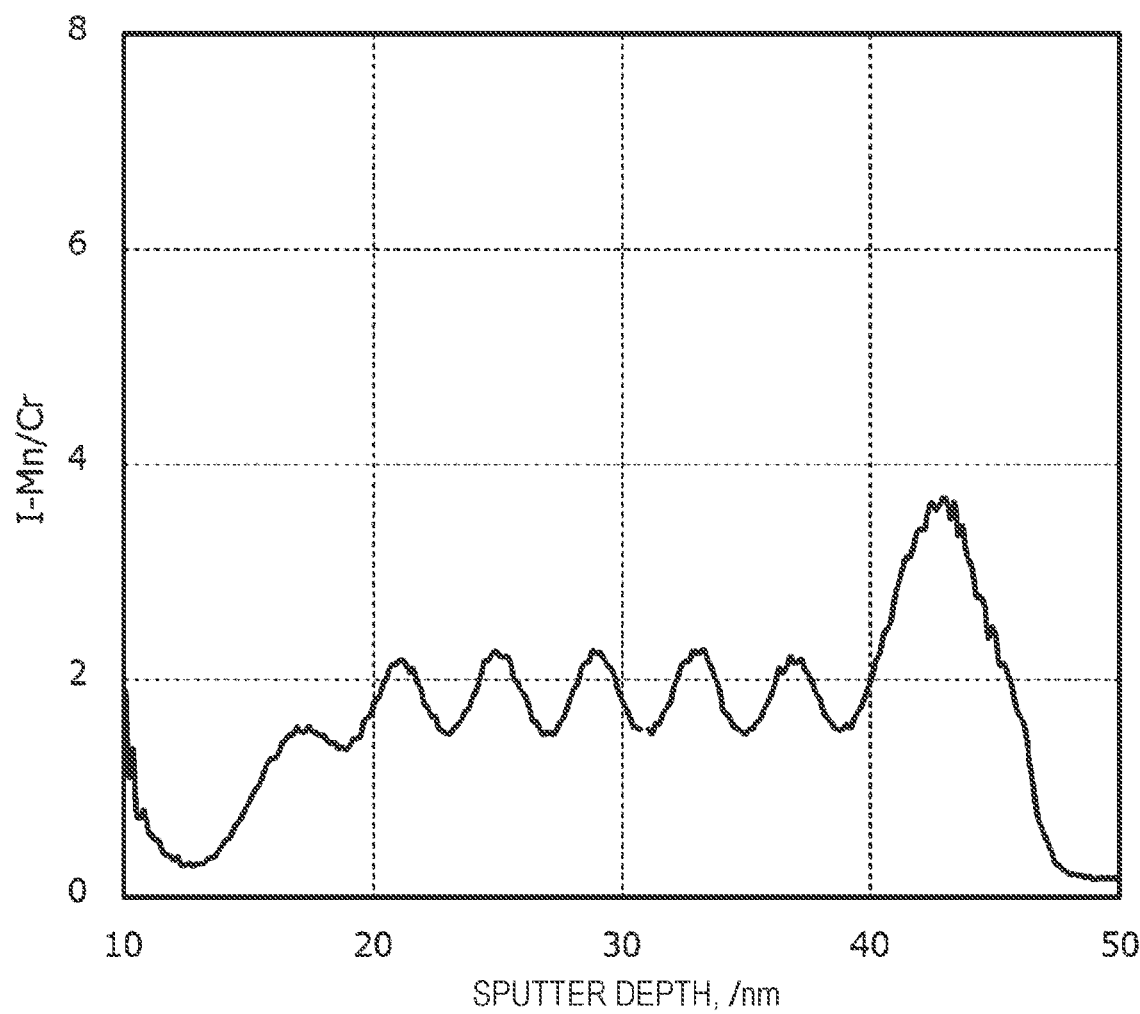
FIG. 24B is a depth profile of I—Mn/Cr of the stacked structure (before annealing treatment)
Figure 25A:
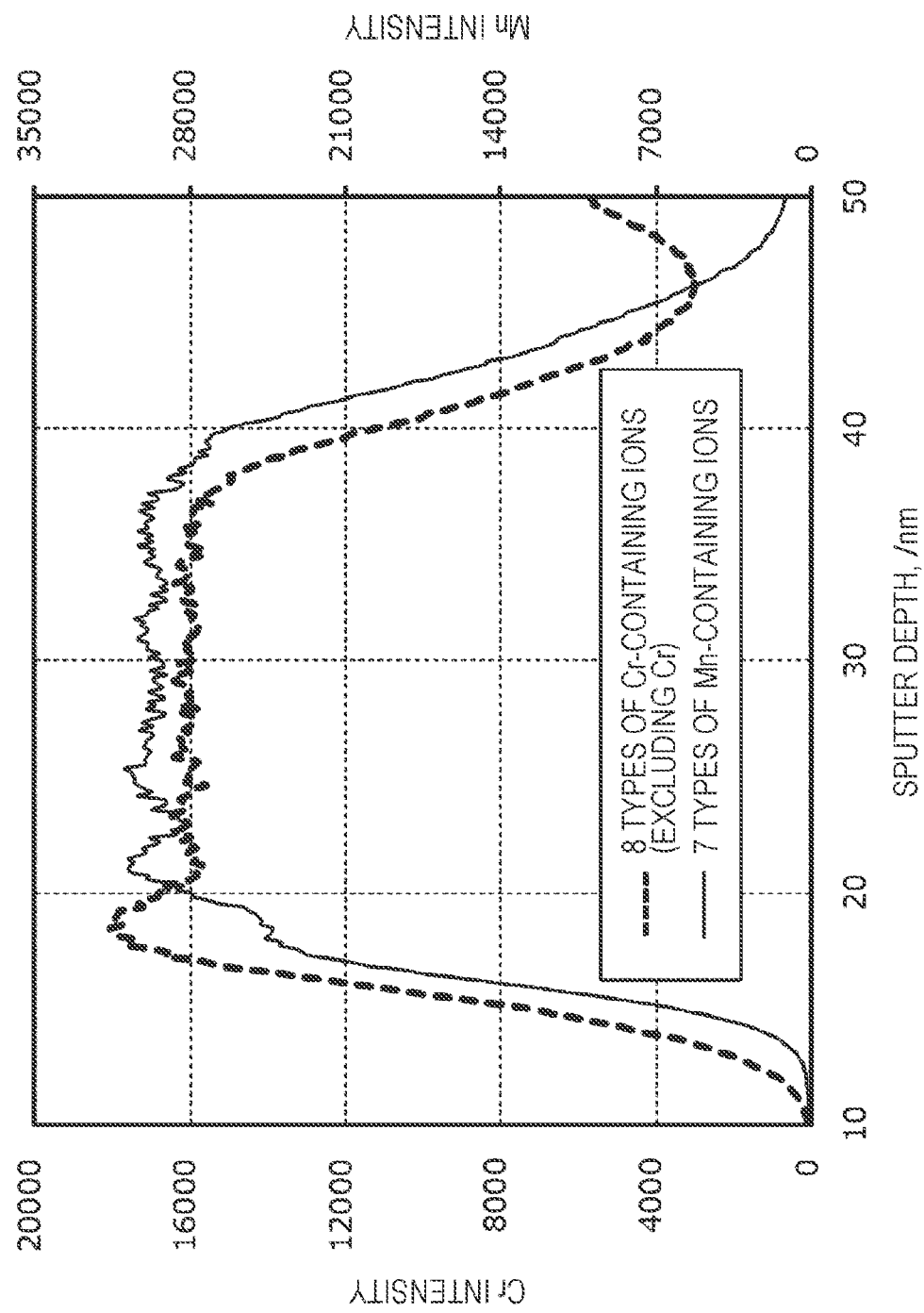
FIG. 25A is depth profiles of the total sum of detected intensities of 7 types of ions related to Mn and the total sum of detected intensities of 7 types of ions related to Cr of an exchange coupling film (A)

As shown in FIG. 23A, interdiffusion of Mn and Cr occurs by annealing treatment inside each unit constituting the unit stacking part and between the stacked plurality of units, and no changes of detected intensities of ions related to Mn and detected intensities of ions related to Cr were observed based on the configuration (alternately stacked structure) of the unit stacking part recognized in FIG. 22A. Accordingly, no regular change was recognized in the depth profile of I—Mn/Cr.

On the other hand, it was obviously recognized that the region closer to the fixed magnetic layer 4 has a region where the I—Mn/Cr is relatively higher than that in the other region. It was thus verified that the antiferromagnetic layer 5 made of an X(Cr—Mn) layer (Pt(Cr—Mn) layer) included in the exchange coupling film (A) includes a first region R1 relatively closer to the fixed magnetic layer 4 and a second region R2 relatively farther from the fixed magnetic layer 4 and that the I—Mn/Cr in the first region R1 is higher than the I—Mn/Cr in the second region R2. In addition, it was also verified that Mn is contained in the entire second region.

As shown in FIGS. 24A, 24B, 25A, and 25B, the tendencies observed in the stacked structure giving the exchange coupling film (A) and in the exchange coupling film (A) were also verified in the stacked structure giving the exchange coupling film (B) and in the exchange coupling film (B).

As obvious from the comparison with the result of the exchange coupling film (A) indicated by the thin broken line in FIG. 25B, the I—Mn/Cr in the first region R1 of the exchange coupling film (B) was lower than the I—Mn/Cr in the first region R1 of the exchange coupling film (A). It is inferred that this reflects that the exchange coupling film (B) is formed from a stacked structure having a configuration in which $Pt_{51at\%}Cr_{49at\%}$ (6) is further provided at a position most closer to the fixed magnetic layer 4 in comparison with the stacked structure giving the exchange coupling film (A).

Incidentally, in this example, the exchange coupling film including the antiferromagnetic layer 5 having a relatively high I—Mn/Cr in the first region R1 was formed from a stacked structure including an unit stacking part in which a plurality of units each consisting of an $X^1Cr$ layer (PtCr layer) and an $X^2Mn$ layer (MnCr layer) were stacked, but is not limited thereto. The exchange coupling film may be formed from a stacked structure prepared by stacking a layer of Mn or an Mn-rich alloy (e.g., $Ir_{22at\%}Mn_{78at\%}$ layer) on the side closer to the fixed magnetic layer 4 and stacking a layer of XCrMn on the layer.

Magnetism Detection Apparatus

Figure 9:
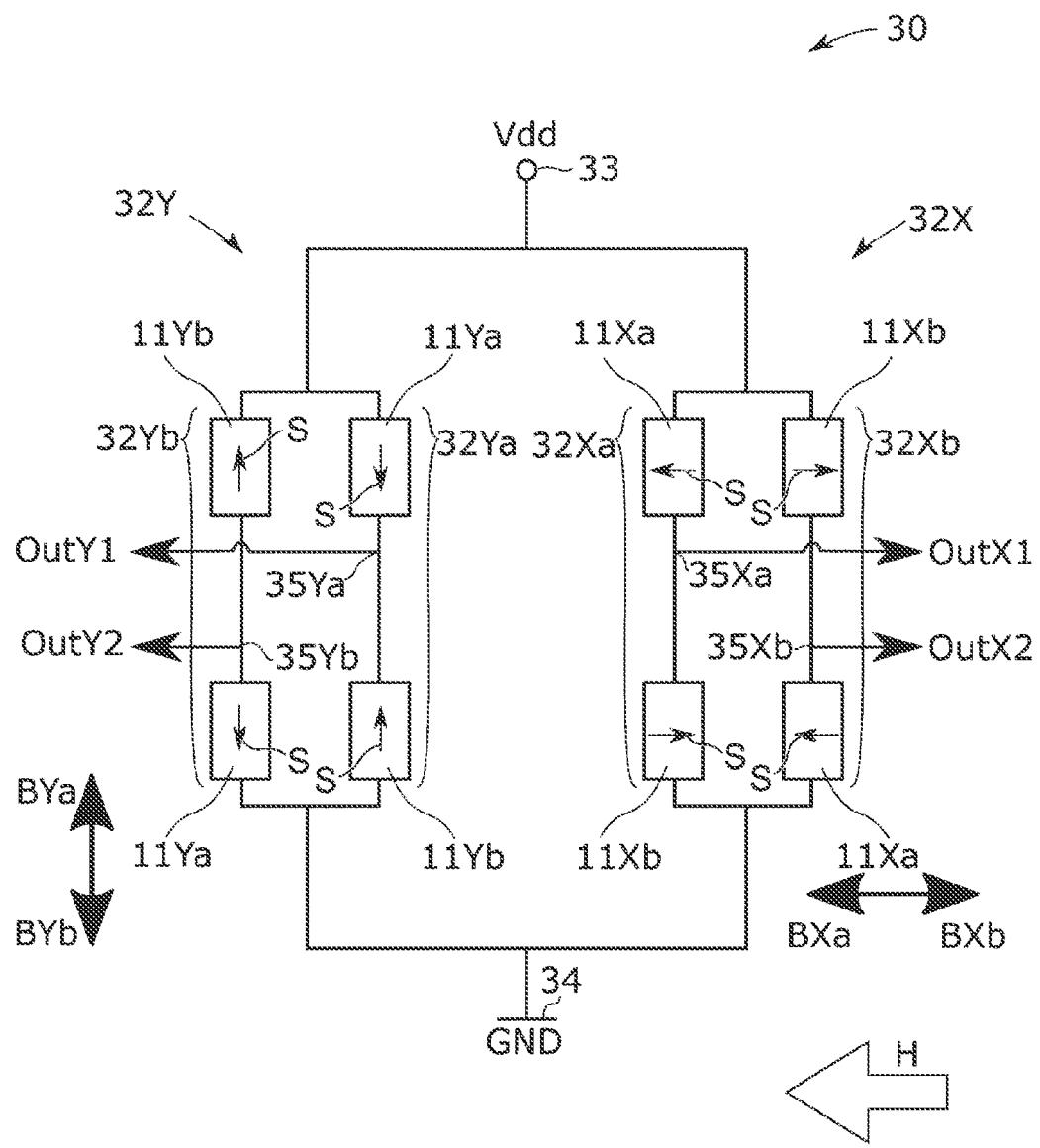
FIG. 9 is a circuit block diagram of a magnetic sensor according to the first embodiment of the present invention.

A position detection sensor (magnetic sensor) including the magnetism detection apparatus according to the first embodiment will now be described. FIG. 9 shows a magnetic sensor 30 in combination with the position detection element 11 shown in FIG. 2. In FIG. 9, the position detection elements 11 having different sensitive axis directions S (indicated by black arrows in FIG. 9) are designated by 11Xa, 11Xb, 11Ya, and 11Yb, respectively, for distinction. In the magnetic sensor 30, the position detection elements 11Xa, 11Xb, 11Ya, and 11Yb are disposed on a single substrate.

The magnetic sensor 30 shown in FIG. 9 includes a full bridge circuit 32X and a full bridge circuit 32Y. The full bridge circuit 32X includes two position detection elements 11Xa and two position detection elements 11Xb, and the full bridge circuit 32Y includes two position detection elements 11Ya and two position detection elements 11Yb. The position detection elements 11Xa, 11Xb, 11Ya, and 11Yb are all the position detection element 11 shown in FIG. 2, and when these elements are not distinguished from each other, they are appropriately referred to as position detection elements 11 hereinafter.

The full bridge circuit 32X and the full bridge circuit 32Y use position detection elements 11 having different sensitive axis directions S indicated by black arrows in FIG. 9 for differentiating the detection magnetic field directions, and the mechanisms for detecting a magnetic field are the same. Accordingly, the mechanism for detecting a magnetic field will now be described using the full bridge circuit 32X.

In FIG. 9, in both the position detection elements 11Xa and 11Xb, the bias application direction B is directed to the BYa side of the BYa-BYb direction. On the other hand, in the position detection elements 11Ya and 11Yb, the bias application direction B is directed to the BXa side of the BXa-BXb direction.

The full bridge circuit 32X is configured by connecting a first serial part 32Xa and a second serial part 32Xb to each other in parallel. The first serial part 32Xa is configured by connecting a position detection element 11Xa and a position detection element 11Xb to each other in serial, and the second serial part 32Xb is configured by connecting a position detection element 11Xb and a position detection element 11Xa to each other in serial.

A power supply voltage Vdd is supplied to a power supply terminal 33 common to the position detection element 11Xa constituting the first serial part 32Xa and the position detection element 11Xb constituting the second serial part 32Xb. A ground terminal 34 common to the position detection element 11Xb constituting the first serial part 32Xa and the position detection element 11Xa constituting the second serial part 32Xb is set to a ground potential GND.

The differential output (OutX1)–(OutX2) between the output potential $(OutX^1)$ at the midpoint 35Xa of the first serial part 32Xa and the output potential $(OutX^2)$ at the midpoint 35Xb of the second serial part 32Xb constituting the full bridge circuit 32X is obtained as the detected output (detected output voltage) VXs in the X direction.

The full bridge circuit 32Y also acts as in the full bridge circuit 32X, and the differential output (OutY1)–(OutY2) between the output potential (OutY1) at the midpoint 35Ya of the first serial part 32Ya and the output potential (OutY2) at the midpoint 35Yb of the second serial part 32Yb is obtained as the detected output (detected output voltage) VYs in the Y direction.

As indicated by black arrows in FIG. 9, the sensitive axis directions S of the position detection element 11Xa and the position detection element 11Xb constituting the full bridge circuit 32X and the sensitive axis directions S of the position detection element 11Ya and the position detection element 11Yb constituting the full bridge circuit 32Y are orthogonal to each other.

In the magnetic sensor 30 shown in FIG. 9, the free magnetic layer 2 (see FIG. 2) of the position detection element 11 is magnetized in a direction along the bias application direction B when it is not applied with a magnetic field H from the outside. When a magnetic field H is applied, the direction of magnetization of the free magnetic layer 2 of each position detection element 11 changes so as to follow the direction of the magnetic field H. On this occasion, the resistance value changes depending on the vector between the fixed magnetization direction (the sensitive axis direction S) of the fixed magnetic layer 4 and the magnetization direction of the free magnetic layer 2.

For example, if the magnetic field H acts in the direction shown in FIG. 9, since the direction of the magnetic field H is the same as the sensitive axis direction S in the position detection element 11Xa constituting the full bridge circuit 32X, the electric resistance value is decreased. In contract, in the position detection element 11Xb, the direction of the sensitive axis and the direction of the magnetic field H are opposite to each other, and the electric resistance value is increased. This change of the electric resistance value makes the detected output voltage VXs=$(OutX^1)$–$(OutX^2)$ maximum. The detected output voltage VXs decreases as the magnetic field H changes to the right with respect to the paper surface (the direction of the BXb side of the BXa-BXb direction), and the detected output voltage VXs becomes zero when the magnetic field H is directed upward (the direction of the BYa side of the BYa-BYb direction) or downward (the direction of the BYb side of the BYa-BYb direction) with respect to the paper surface of FIG. 9.

In contrast, in the full bridge circuit 32Y, when the magnetic field H is directed to the left (the direction of the BXa side of the BXa-BXb direction) with respect to the paper surface as shown in FIG. 9, since the direction of magnetization of the free magnetic layer (the direction following the bias application direction B) is orthogonal to the sensitive axis direction S (the fixed magnetization direction) in all the position detection elements 11, the electric resistance values of the position detection element 11Ya and the position detection element 11Xb are the same.

Accordingly, the detected output voltage VYs is zero. When the magnetic field H acts downward with respect to the paper surface (the direction on the BYb side of the BYa-BYb direction) in FIG. 9, the detected output voltage VYs=(OutY1)−(OutY2) of the full bridge circuit 32Y is the maximum, and the detected output voltage VYs decreases as the magnetic field H changes upward with respect to the paper surface (the direction of the BYa side of the BYa-BYb direction).

Thus, a change in the direction of the magnetic field H results in changes of the detected output voltages VXs and VYs of the full bridge circuit 32X and the full bridge circuit 32Y. Accordingly, based on the detected output voltages VXs and VYs obtained from the full bridge circuit 32X and the full bridge circuit 32Y, it is possible to detect the movement direction and the movement amount (relative position) of a detection object.

FIG. 9 shows a magnetic sensor 30 configured such that the magnetic fields in the X-direction and in the Y-direction orthogonal to the X-direction. However, the magnetic sensor may be configured by including the full bridge circuit 32X only or the full bridge circuit 32Y only that detects the magnetic field in the X-direction or the Y-direction only. Alternatively, the magnetic sensor may be configured by including a half bridge circuit including any one of the first serial part 32Xa, the second serial part 32Xb, the first serial part 32Ya, and the second serial part 32Yb.

Figure 10:
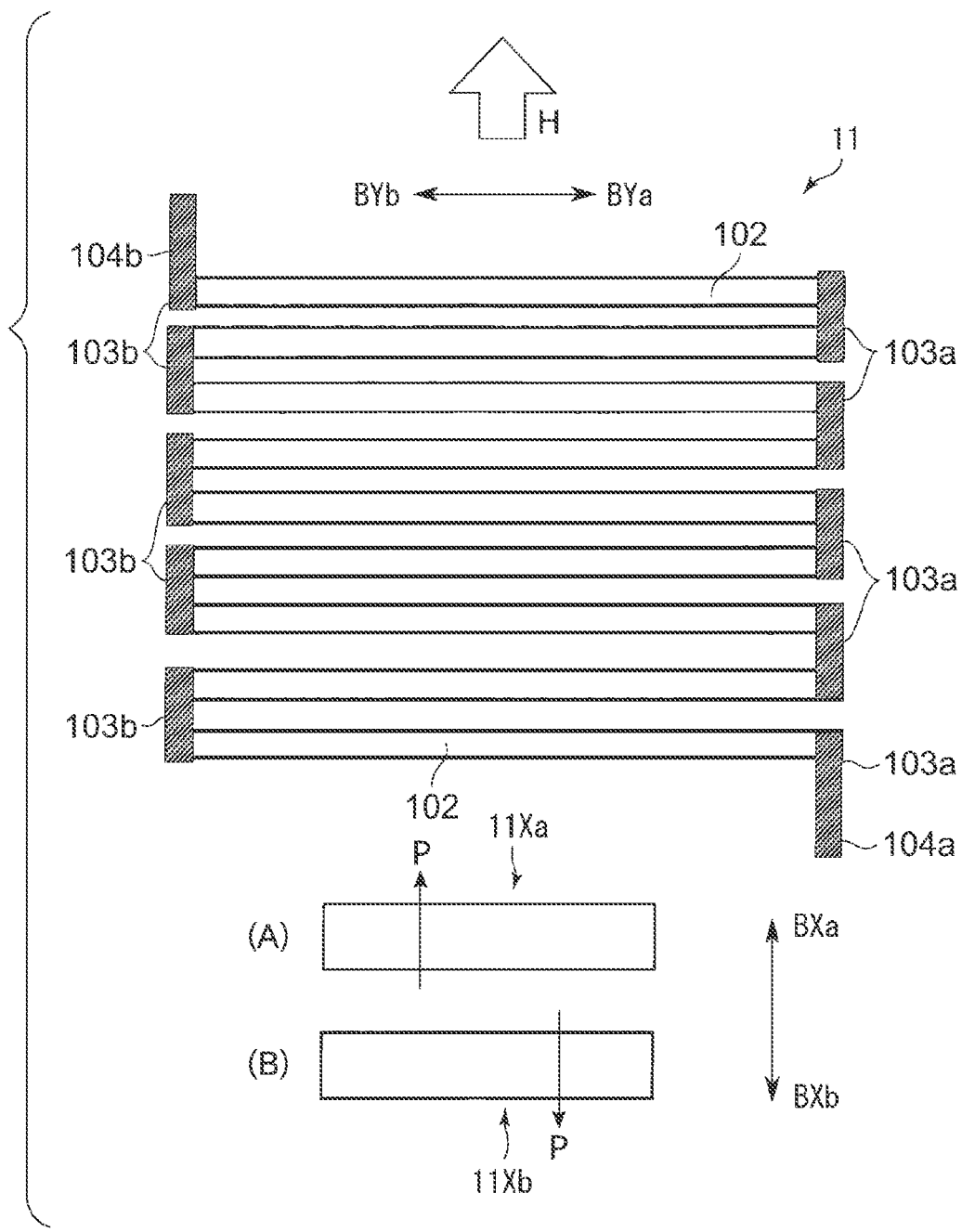
FIG. 10 is a plan view of a position detection element that is used in magnetic sensor.

FIG. 10 shows planar structures of the position detection element 11Xa and the position detection element 11Xb. In FIGS. 9 and 10, the BXa-BXb direction is the X-direction. The fixed magnetization directions P of the position detection elements 11Xa and 11Xb are indicated by arrows in (A) and (B) of FIG. 10. The fixed magnetization directions P of the position detection element 11Xa and the position detection element 11Xb are in the X-direction and are opposite to each other. The fixed magnetization directions P are equal to the sensitive axis direction S.

As shown in FIG. 10, the position detection element 11 includes stripe-shaped element portions 102. In each of the element portions 102, a plurality of metal layers (alloy layers) are stacked to constitute a giant magnetoresistance effect (GMR) film. The element portions 102 each have the longitudinal direction in the BYa-BYb direction. The plurality of element portions 102 are arrayed in parallel to each other. The illustrated right edges (the edges on the BYa side of the BYa-BYb direction) of adjacent element portions 102 are connected to each other via a conductive portion 103a, and the illustrated left edges (the edges on the BYb side of the BYa-BYb direction) of adjacent element portions 102 are connected to each other via a conductive portion 103b. The illustrated right edges (the edges on the BYa side of the BYa-BYb direction) and the illustrated left edges (the edges on the BYb side of the BYa-BYb direction) of the element portions 102 are alternately connected to the conductive portions 103a and 103b, and the element portions 102 are connected in a so-called meander shape. In the position detection elements 11Xa and 11Xb, the conductive portion 103a illustrated at the lower right portion is united with a connection terminal 104a, and the conductive portion 103b illustrated in the upper light portion is united with a connection terminal 104b.

Figure 11:
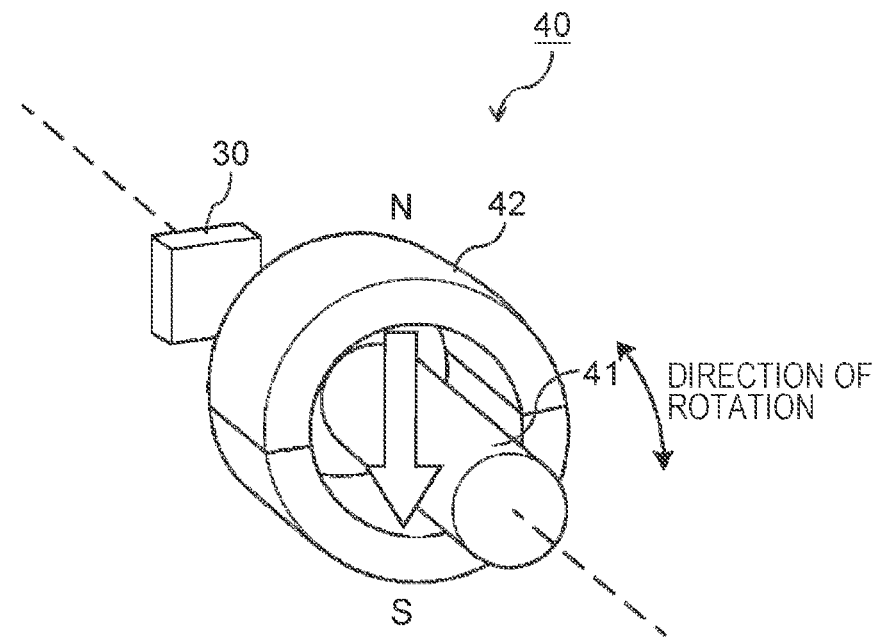
FIG. 11 is an explanatory diagram illustrating a configuration of a position detection apparatus using a magnetic sensor according to an embodiment of the present invention.

FIG. 11 is an explanatory diagram illustrating a configuration of a position detection apparatus 40 using the magnetic sensor 30 according to an embodiment of the present invention. The position detection apparatus 40 of the present embodiment shown in the drawing detects the position of a rotating shaft 41 as the detection object based on a change in the magnetic field from a rotating magnet 42 generated by rotation of the rotating shaft 41 and includes the magnetic sensor 30 including a plurality of the above-described position detection elements 11.

As shown in FIG. 11, in the position detection apparatus 40, the magnetic sensor 30 is provided so as to face a cylindrical rotating magnet 42 attached to a rotating shaft 41. When the rotating shaft 41 rotates integrally with the steering shaft of an automobile, the position detection apparatus 40 functions as a rotation angle detector for detecting the angle of rotation of the steering shaft.

In the rotating magnet 42, the N and S poles are polarized and magnetized, and the direction connecting the N pole and the S pole is the radial direction of the rotating shaft 41. When the rotating shaft 41 rotates integrally with the steering shaft of an automobile, the steering shaft rotates according to the rotational operation of the steering wheel, and the rotating shaft 41 and the rotating magnet 42 rotates according to the rotation of the steering shaft. On this occasion, since the position of the magnetic sensor 30 does not change, the relative position between the rotating magnet 42 and the magnetic sensor 30 changes, and the direction of the external magnetic field changes. The magnetic sensor 30 of the position detection apparatus 40, as described with reference to FIG. 9, includes position detection elements 11 including fixed magnetic layers having different fixed magnetization directions. The resistance of each position detection element 11 changes according to the change of the external magnetic field, which is read out as a voltage change output from a bridge circuit. A predetermined arithmetic operation is performed based on the output of the voltage change (voltage change signal) to detect the steering angle of a steering wheel.

Figure 12:
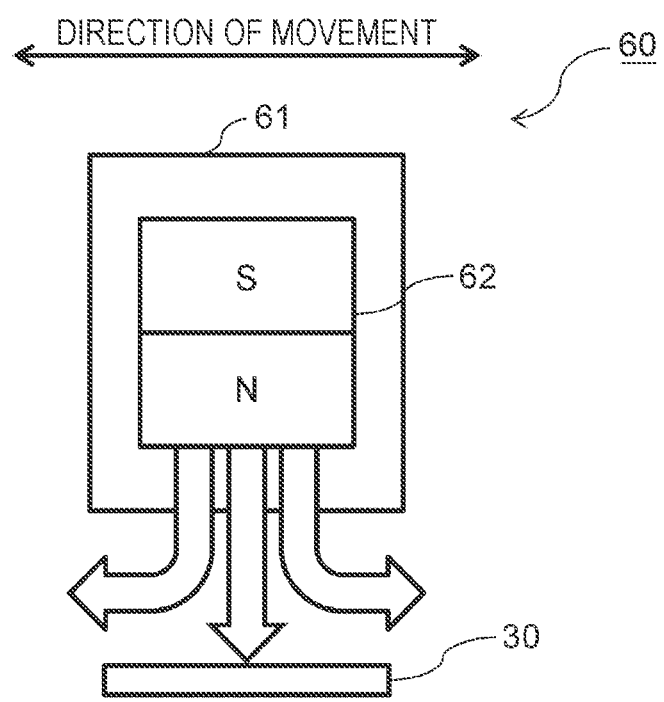
FIG. 12 is an explanatory diagram illustrating another configuration of a position detection apparatus using a magnetic sensor according to an embodiment of the present invention.

FIG. 12 is an explanatory diagram illustrating the configuration of a position detection apparatus 60 using a magnetic sensor 30 according to an embodiment of the present invention. The position detection apparatus 60 shown in the drawing includes a magnet 62 attached to a detection object 61 and a magnetic sensor 30. As in the above-described position detection apparatus 40, the magnetic sensor 30 detects the magnetic field from the magnet 62 that changes by the movement of the detection object 61 and thereby detects the position of the detection object 61.

The embodiments explained above are described to facilitate understanding of the present invention and are not described to limit the present invention. Accordingly, each component disclosed in the embodiments is intended to include all design changes and equivalents within the technical scope of the present invention. For example, in the above-described exchange coupling film, the PtMn layer 5A is in contact with the fixed magnetic layer 4, that is, the PtMn layer 5A is directly stacked on the stacked fixed magnetic layer 4. However, another layer containing Mn (for example, an Mn layer or an IrMn layer 5C) may be stacked between the PtMn layer 5A and the fixed magnetic layer 4. In addition, in the above-described embodiment, the fixed magnetic layer 4 is stacked at a position closer to the base layer 1 than the antiferromagnetic layers 5, 51, and 52, but the antiferromagnetic layers 5, 51, and 52 may be stacked at a position closer to the base layer 1 than the fixed magnetic layer 4.

EXAMPLES

The present invention will now be further specifically described by examples, but the scope of the present invention is not limited to the examples.

Example 1

A position detection element 12 (see FIG. 6) having the following film configuration was manufactured. In the following Examples and Comparative Examples, each numerical value in parentheses indicates the film thickness (angstrom). The position detection element 12 was annealed at 350° C. for 20 hours to generate exchange coupling between the fixed magnetic layer 4 and the antiferromagnetic layer 5.

Substrate/base layer 1: NiFeCr (40)/free magnetic layer 2: [$Ni_{81.5at\%}Fe_{18.5at\%}$ (15)/$Co_{90at\%}Fe_{10at\%}$ (20)]/non-magnetic material layer 3: Cu (30)/fixed magnetic layer 4: $Co_{90at\%}Fe_{10at\%}$ (24)/non-magnetic material layer 3: Ru (4)/fixed magnetic layer 4: $Co_{60at\%}Fe_{40at\%}$ (18)/antiferromagnetic layer 5: [IrMn layer 5C: $Ir_{80at\%}Mn_{20at\%}$ (6)/PtMn layer 5A: $Pt_{50at\%}Mn_{50at\%}$ (12)/PtCr layer 5B: $Pt_{51at\%}Cr_{49at\%}$ (300)]/protection layer 6: [Ta (100)/Ru (20)]

Examples 2 to 6

Position detection elements 12 and 112 were manufactured as in Example 1 except that the antiferromagnetic layer 5: [IrMn layer 5C: $Ir_{80at\%}Mn_{20at\%}$ (6)/PtMn layer 5A: $Pt_{50at\%}Mn_{50at\%}$ (12)/PtCr layer 5B: $Pt_{51at\%}Cr_{49at\%}$ (300)] was changed as follows and were annealed under the same conditions to generate exchange coupling between the fixed magnetic layer 4 and the antiferromagnetic layer 5.

Example 2

[IrMn layer 5C: $Ir_{80at\%}Mn_{20at\%}$ (6)/PtMn layer 5A: $Pt_{50at\%}Mn_{50at\%}$ (14)/PtCr layer 5B: $Pt_{51at\%}Cr_{49at\%}$ (300)]

Example 3

[IrMn layer 5C: $Ir_{80at\%}Mn_{20at\%}$ (8)/PtMn layer 5A: $Pt_{50at\%}Mn_{50at\%}$ (12)/PtCr layer 5B: $Pt_{51at\%}Cr_{49at\%}$ (300)]

Example 4

[IrMn layer 5C: $Ir_{80at\%}Mn_{20at\%}$ (8)/PtMn layer 5A: $Pt_{50at\%}Mn_{50at\%}$ (14)/PtCr layer 5B: $Pt_{51at\%}Cr_{49at\%}$ (300)]

Example 5

[unit stacking part 5U1-5U7: 7-layer structure, each layer composed of [PtMn layer 51B: $Pt_{50at\%}Mn_{50at\%}$ (6)/PtCr layer 51A: $Pt_{51at\%}Cr_{49at\%}$ (34)]]

Example 6

[PtCr layer 51A: $Pt_{51at\%}Cr_{49at\%}$ (6)/unit stacking part 5U1-5U7: [7-layer structure, each layer composed of PtMn layer 51B: $Pt_{50at\%}Mn_{50at\%}$ (6)/PtCr layer 51A: $Pt_{51at\%}Cr_{49at\%}$ (34)]]

Comparative Examples 1 and 2

Position detection elements were manufactured as in Example 1 except that the antiferromagnetic layer 5: [IrMn layer 5C: $Ir_{80at\%}Mn_{20at\%}$ (6)/PtMn layer 5A: $Pt_{50at\%}Mn_{50at\%}$ (12)/PtCr layer 5B: $Pt_{51at\%}Cr_{49at\%}$ (300)] in Example 1 was changed as follows and were annealed under the same conditions to generate exchange coupling between the fixed magnetic layer and the antiferromagnetic layer.

Comparative Example 1

$Ir_{20at\%}Mn_{80at\%}$ (80)

Comparative Example 2

$Pt_{51at\%}Cr_{49at\%}$ (300)

Reliability Test in High Temperature Environment

Figure 13:
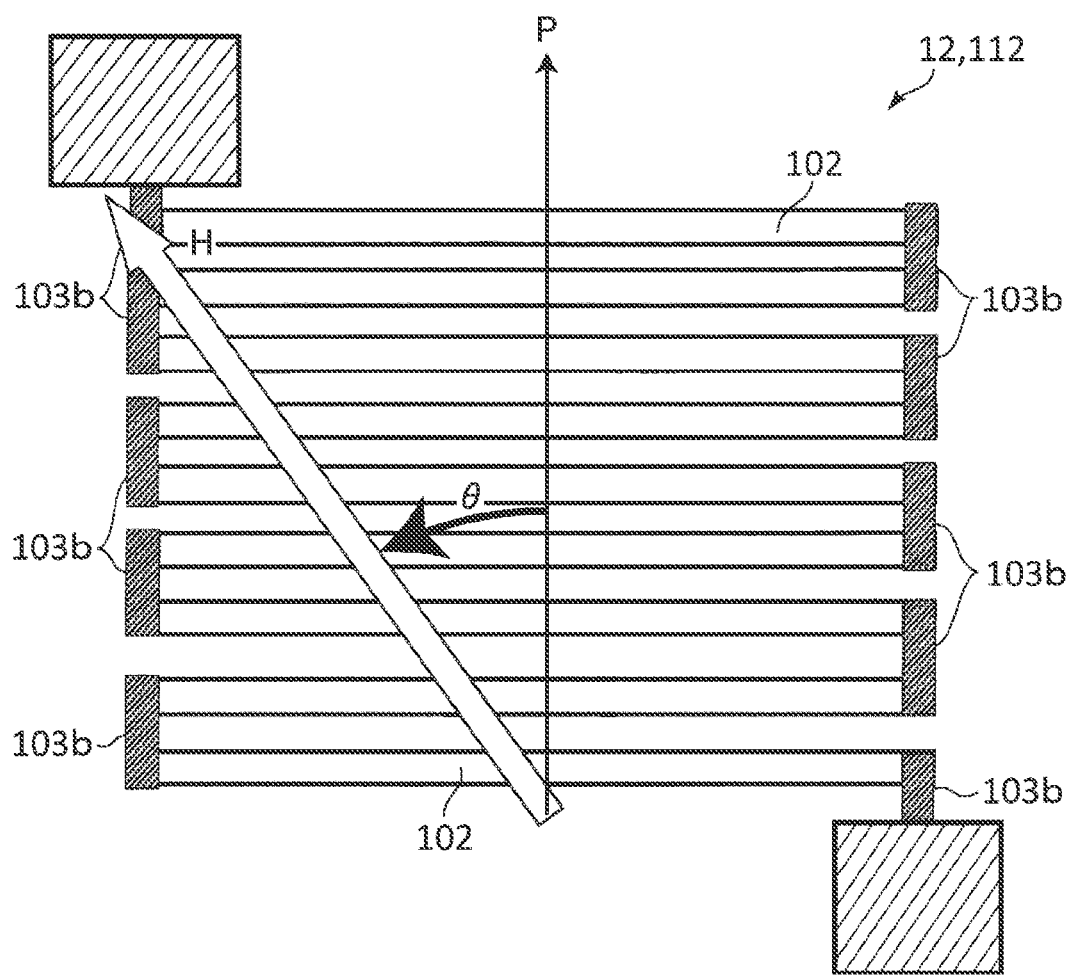
FIG. 13 is an explanatory diagram of a method for testing reliability in high temperature (200° C., 250° C.) environments.

FIG. 13 is an explanatory diagram of a method for testing reliability in high temperature (200° C., 250° C.) environments.

Figure 14:
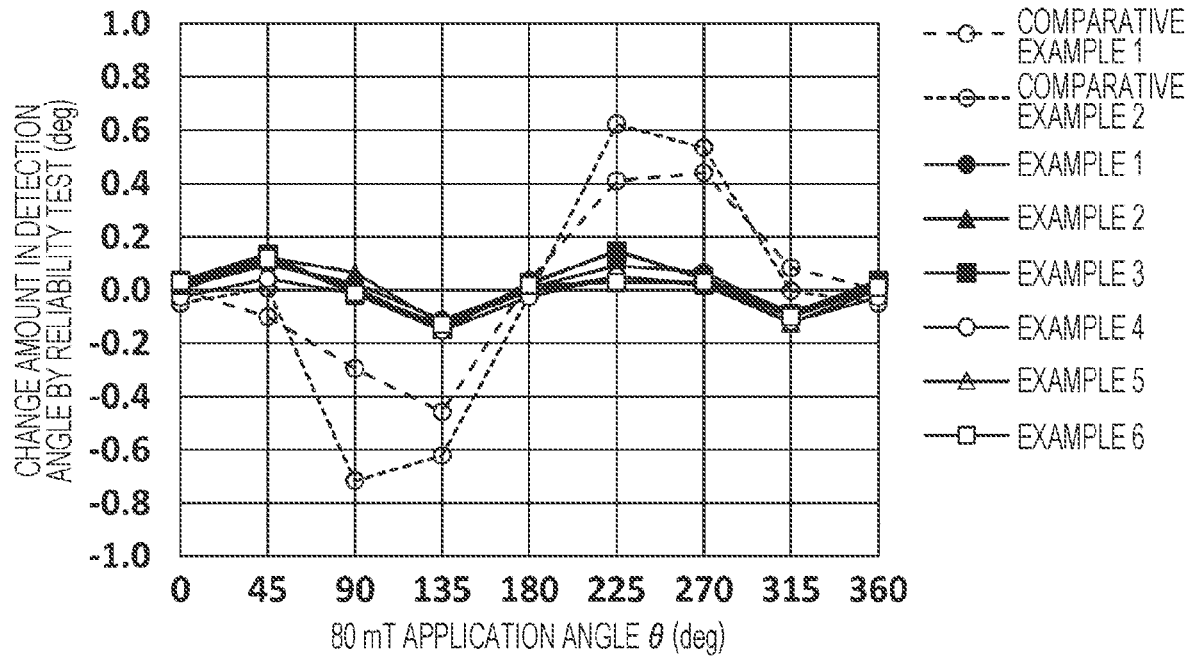
FIG. 14 is a graph showing the results of the reliability test (200° C.) in Examples 1 to 6 and Comparative Examples 1 and 2.

A magnetic field of 80 mT was applied to each of the position detection elements 12 and 112 of Examples 1 to 6 and Comparative Examples 1 and 2 under a condition of 200° C. for 100 hours, as shown in FIG. 13, in the direction of each magnetic field application angle θ (changing from 0° to 360° by 45° increments) shown in Table 1 with respect to the magnetization direction (the fixed magnetization direction P) of the fixed magnetic layer 4 (see FIG. 2), and the change in the detection angle of the position detection element 12 was then calculated. The detection angle was measured by returning the temperature to room temperature before and after the reliability test in an environment of 200° C. and then applying a magnetic field of 60 mT to each of the position detection elements 12 and 112 with rotation of 360° to measure the output waveform. The same measurement was performed before and after the 200° C. reliability test, and the change in the waveform with respect to that before the test was analyzed to calculate the change in the detection angle of the element in the 200° C. reliability test. Table 1 and FIG. 14 show the averages of the results of measurement of 60 to 70 position detection elements 12 or 112 in each of Examples and Comparative Examples.

TABLE 1

| Magnetic field application angle (deg) | Change amount of detection angle (deg) | | | | | | | |
|---|---|---|---|---|---|---|---|---|
| | Example 1 | Example 2 | Example 3 | Example 4 | Example 5 | Example 6 | Comparative Example 1 | Comparative Example 2 |
| 0 | 0.01 | 0.00 | 0.04 | −0.03 | 0.02 | 0.03 | 0.00 | −0.05 |
| 45 | 0.10 | 0.12 | 0.14 | 0.04 | 0.11 | 0.12 | −0.10 | 0.01 |
| 90 | 0.03 | 0.07 | −0.02 | −0.01 | 0.01 | −0.01 | −0.29 | −0.72 |
| 135 | −0.11 | −0.13 | −0.15 | −0.15 | −0.15 | −0.13 | −0.46 | −0.62 |
| 180 | 0.01 | 0.00 | 0.03 | −0.02 | 0.02 | 0.02 | 0.04 | −0.02 |
| 225 | 0.09 | 0.05 | 0.14 | 0.05 | 0.15 | 0.03 | 0.41 | 0.62 |
| 270 | 0.07 | 0.02 | 0.05 | 0.02 | 0.04 | 0.03 | 0.44 | 0.53 |
| 315 | −0.09 | −0.12 | −0.09 | −0.12 | −0.08 | −0.10 | 0.08 | 0.00 |
| 360 | 0.01 | 0.00 | 0.04 | −0.03 | 0.02 | 0.01 | 0.00 | −0.05 |

Figure 15:
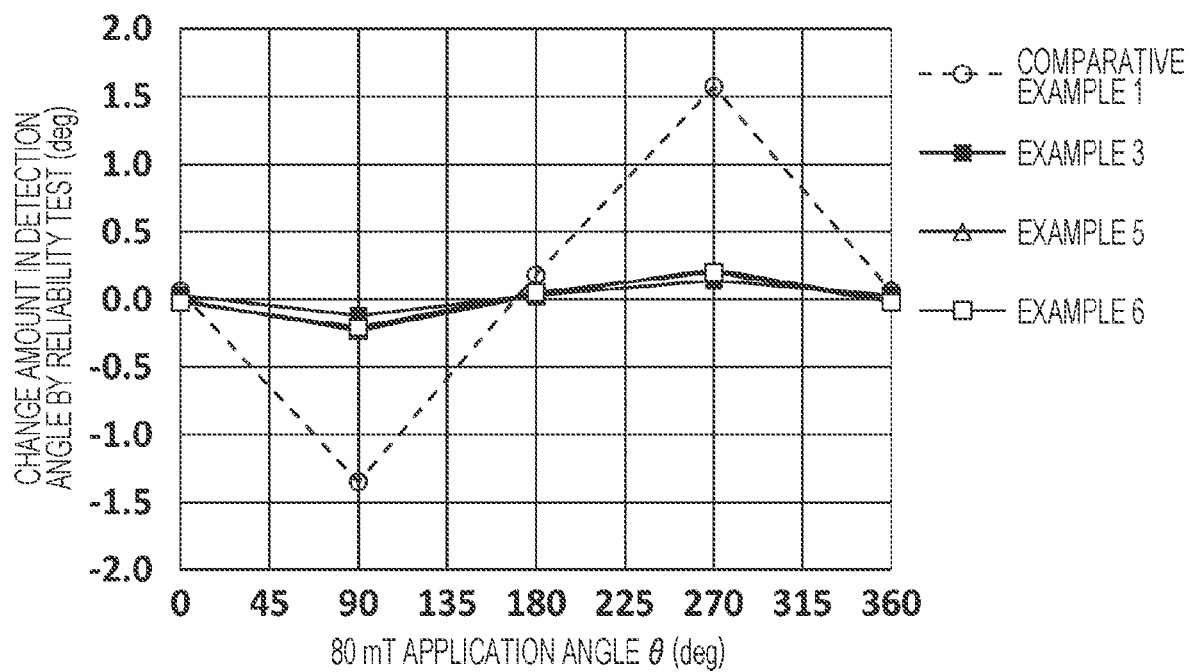
FIG. 15 is a graph showing the results of the reliability test (250° C.) in Examples 3, 5, and 6 and Comparative Example 1.

Table 2 and FIG. 15 show the averages of the results of each of the position detection elements 12 and 112 of Examples 3, 5, and 6 and Comparative Example 1 measured as in the 200° C. reliability test except that the temperature condition in the reliability test was changed to 250° C. and the magnetic field application angle θ was changed from 0° to 360° by 90° increments.

TABLE 2

| Magnetic field application angle (deg) | Change amount of detection angle (deg) | | | |
|---|---|---|---|---|
| | Example 3 | Example 5 | Example 6 | Comparative Example 1 |
| 0 | 0.03 | −0.01 | −0.02 | 0.06 |
| 90 | −0.12 | −0.23 | −0.21 | −1.35 |
| 180 | 0.03 | 0.03 | 0.05 | 0.18 |
| 270 | 0.14 | 0.22 | 0.20 | 1.57 |
| 360 | 0.03 | −0.01 | −0.02 | 0.06 |

As shown in Tables 1 and 2 and FIGS. 14 and 15, in all the position detection elements 12 and 112 of Examples 1 to 6, the change amount of the detection angle by the reliability test was small, compared to the position detection elements of Comparative Examples 1 and 2, and the detection accuracy in high temperature conditions was high. Since the results of Examples 1 to 6 were good, it is inferred that the position detection elements 12 and 112 had the following four excellent properties.

(1) the exchange coupling magnetic field between the fixed magnetic layer 4 and the antiferromagnetic layer 5 is large at room temperature, (2) the temperature characteristic of the exchange coupling magnetic field is good, that is, a large exchange coupling magnetic field can be maintained in high temperature conditions, (3) the (exchange coupling magnetic field)/(coercive force) ratio is positive and large, and (4) the (residual magnetization)/(saturated magnetization) ratio is negative with a large absolute value.

Magnitude of Exchange Coupling Magnetic Field and Temperature Characteristic Thereof Accordingly, for the following Examples and Comparative Examples, the magnitude of the exchange coupling magnetic field between the fixed magnetic layer 4 and the antiferromagnetic layer 5 and the temperature characteristic thereof were measured.

Example 7

A position detection element 12 having the following film configuration was manufactured and was annealed at 350° C. for 20 hours to generate exchange coupling between the fixed magnetic layer 4 and the antiferromagnetic layer 5.

Substrate/base layer 1: NiFeCr (42)/non-magnetic material layer 3: [Cu (40)/Ru (20)]/fixed magnetic layer 4: $Co_{60at\%}Fe_{40at\%}$ (100)/antiferromagnetic layer 5: [IrMn layer 5C: $Ir_{22at\%}Mn_{78at\%}$ (6)/PtMn layer 5A: $Pt_{50at\%}Mn_{50at\%}$ (12)/PtCr layer 5B: $Pt_{51at\%}Cr_{49at\%}$ (300)]/protection layer 6: Ta (100)

Example 8

A position detection element 112 was manufactured as in Example 7 except that the antiferromagnetic layer 5: [IrMn layer 5C: $Ir_{22at\%}Mn_{78at\%}$ (6)/PtMn layer 5A: $Pt_{50at\%}Mn_{50at\%}$ (12)/PtCr layer 5B: $Pt_{51at\%}Cr_{49at\%}$ (300)] was changed to the following configuration and was annealed under the same conditions to generate exchange coupling between the fixed magnetic layer 4 and the antiferromagnetic layer 5.

Example 8

[PtCr layer 51A: $Pt_{51at\%}Cr_{49at\%}$ (6)/unit stacking part 5U1-5U7: [7-layer structure, each layer composed of PtMn layer 51B: $Pt_{50at\%}Mn_{50at\%}$ (6)/PtCr layer 51A: $Pt_{51at\%}Cr_{49at\%}$ (34)]]

Comparative Example 3

A position detection element having the following film configuration was manufactured and was annealed at 350° C. for 20 hours to generate exchange coupling between the fixed magnetic layer and the antiferromagnetic layer.

Substrate/base layer: NiFeCr (42)/non-magnetic material layer: [Cu (40)/Ru (20)]/fixed magnetic layer: $Co_{60at\%}Fe_{40at\%}$ (100)/antiferromagnetic layer: $Ir_{22at\%}Mn_{78at\%}$ (80)/protection layer: Ta (100)

Comparative Example 4

A position detection element having the following film configuration was manufactured and was annealed at 350° C. for 20 hours to generate exchange coupling between the fixed magnetic layer and the antiferromagnetic layer.

Substrate/base layer: NiFeCr (42)/antiferromagnetic layer: $Pt_{51at\%}Cr_{49at\%}$ (300)/fixed magnetic layer: $Co_{90at\%}Fe_{10at\%}$ (100)/protection layer: Ta (90)

Figure 16:
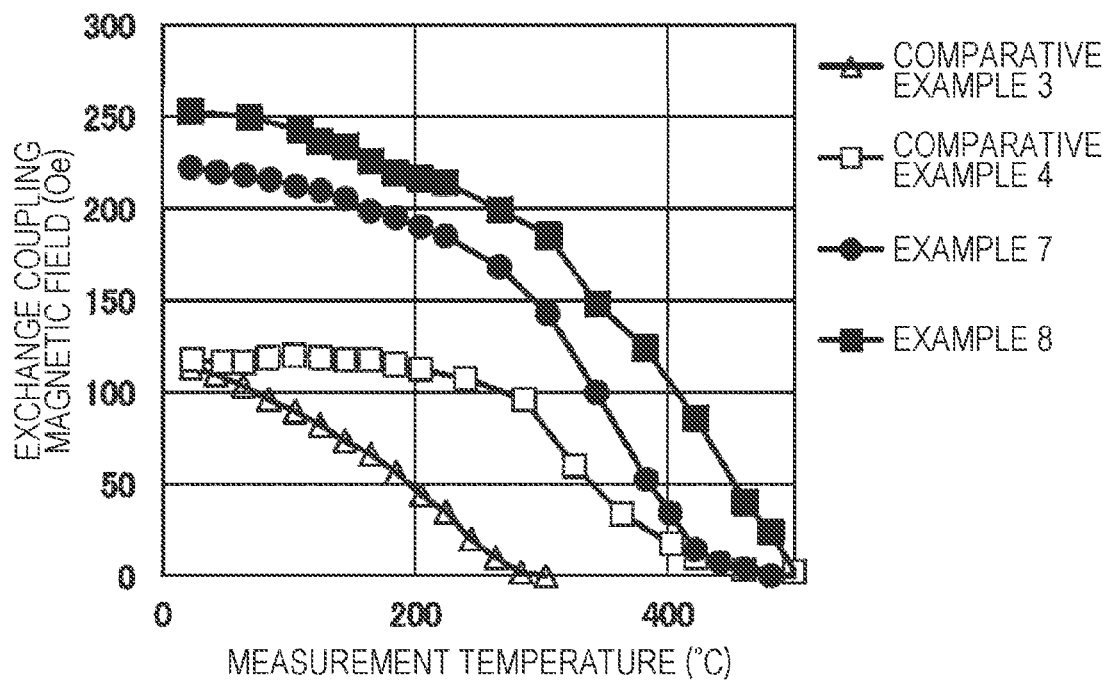
FIG. 16 is a graph showing a relationship between the measurement temperature and the exchange coupling magnetic field in Examples 7 and 8 and Comparative Examples 3 and 4.
Figure 17:
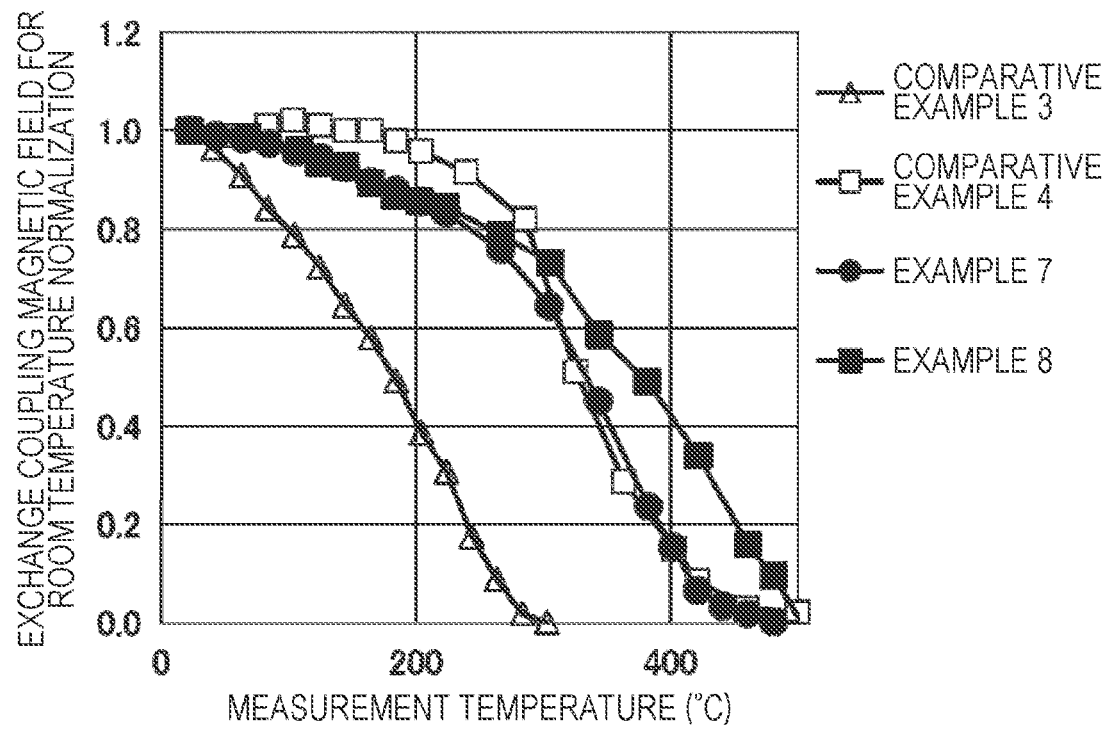
FIG. 17 is a graph of the exchange coupling magnetic field at each temperature of FIG. 16 normalized with the exchange coupling magnetic field at room temperature.

FIG. 16 is a graph showing a relationship between the measurement temperature and the exchange coupling magnetic field in Examples 7 and 8 and Comparative Examples 3 and 4. FIG. 17 is a graph of the exchange coupling magnetic field at each temperature of FIG. 16 normalized with the exchange coupling magnetic field at room temperature. As shown in FIG. 16, in each of the position detection elements 12 and 112 in Examples 7 and 8, the magnitude of the exchange coupling magnetic field between the fixed magnetic layer 4 and the antiferromagnetic layer 5 at room temperature was about two times or more the magnitude in Comparative Examples 3 and 4. The position detection elements 12 and 112 of Examples 7 and 8 maintained the large exchange coupling magnetic field even in a high temperature environment and had good temperature characteristics, compared to Comparative Examples 3 and 4. In addition, by stacking the units, it was possible to increase the exchange coupling magnetic field in a wide temperature range and to suppress the exchange coupling magnetic field from decreasing in a high temperature environment.

Incidentally, in Comparative Example 4 in which the antiferromagnetic layer was made of $Pt_{51at\%}Cr_{49at\%}$, the exchange coupling magnetic field in high temperature conditions was higher than that in Comparative Example 3 in which the antiferromagnetic layer was made of $Ir_{22at\%}Mn_{78at\%}$. However, as shown in FIG. 14, the change amount of the detection angle after the test in Comparative Example 2 using $Pt_{51at\%}Cr_{49at\%}$ was larger than that in Comparative Example 1 using $Ir_{20at\%}Mn_{80at\%}$. According to these results, it is inferred that the change amount of the detection angle is not determined by the magnitude of the exchange coupling magnetic field only. Possible factors that influence the change amount of the detection angle, other than the magnitude of the exchange coupling magnetic field, are, for example, the (exchange coupling magnetic field)/(coercive force) ratio and the (residual magnetization)/(saturated magnetization) ratio.

(Exchange Coupling Magnetic Field)/(Coercive Force) Ratio and (Residual Magnetization)/(Saturated Magnetization) Ratio Accordingly, in order to evaluate the (exchange coupling magnetic field)/(coercive force) ratio and the (residual magnetization)/(saturated magnetization) ratio, the VSM curve of the fixed magnetic layer 4 for each of the following Examples and Comparative Examples was measured, and the exchange coupling magnetic field (Hex), the coercive force (Hc), the saturated magnetization (Ms), and the residual magnetization (M0) were determined (see FIG. 1).

Example 9

A position detection element 12 having the following film configuration was manufactured and was annealed at 350° C. for 20 hours to generate exchange coupling between the fixed magnetic layer 4 and the antiferromagnetic layer 5.

Substrate/base layer 1: NiFeCr (42)/non-magnetic material layer 3: [Cu (40)/Ru (20)]/fixed magnetic layer 4: $Co_{60at\%}Fe_{40at\%}$ (20)/antiferromagnetic layer 5: [IrMn layer 5C: $Ir_{22at\%}Mn_{78at\%}$ (6)/PtMn layer 5A: $Pt_{50at\%}Mn_{50at\%}$ (12)/PtCr layer 5B: $Pt_{51at\%}Cr_{49at\%}$ (300)]/protection layer 6: Ta (100)

Examples 10 to 14

Position detection elements 12 and 112 were manufactured as in Example 9 except that the antiferromagnetic layer 5: [IrMn layer 5C: $Ir_{22at\%}Mn_{78at\%}$ (6)/PtMn layer 5A: $Pt_{50at\%}Mn_{50at\%}$ (12)/PtCr layer 5B: $Pt_{51at\%}Cr_{49at\%}$ (300)] was changed as follows and were annealed under the same conditions to generate exchange coupling between the fixed magnetic layer 4 and the antiferromagnetic layer 5.

Example 10

[IrMn layer 5C: $Ir_{22at\%}Mn_{78at\%}$ (6)/PtMn layer 5A: $Pt_{50at\%}Mn_{50at\%}$ (14)/PtCr layer 5B: $Pt_{51at\%}Cr_{49at\%}$ (300)]

Example 11

[IrMn layer 5C: $Ir_{22at\%}Mn_{78at\%}$ (8)/PtMn layer 5A: $Pt_{50at\%}Mn_{50at\%}$ (12)/PtCr layer 5B: $Pt_{51at\%}Cr_{49at\%}$ (300)]

Example 12

[IrMn layer 5C: $Ir_{22at\%}Mn_{78at\%}$ (8)/PtMn layer 5A: $Pt_{50at\%}Mn_{50at\%}$ (14)/PtCr layer 5B: $Pt_{51at\%}Cr_{49at\%}$ (300)]

Example 13

[unit stacking part 5U1-5U7: [7-layer structure, each layer composed of PtMn layer 51B: $Pt_{50at\%}Mn_{50at\%}$ (6)/PtCr layer 51A: $Pt_{51at\%}Cr_{49at\%}$ (34)]]

Example 14

[PtCr layer 51A: $Pt_{51at\%}Cr_{49at\%}$ (6)/unit stacking part 5U1-5U7: [7-layer structure, each layer composed of PtMn layer 51B: $Pt_{50at\%}Mn_{50at\%}$ (6)/PtCr layer 51A: $Pt_{51at\%}Cr_{49at\%}$ (34)]]

Comparative Examples 5 and 6

Position detection elements were manufactured as in Example 9 except that the antiferromagnetic layer 5: [IrMn layer 5C: $Ir_{22at\%}Mn_{78at\%}$ (6)/PtMn layer 5A: $Pt_{50at\%}Mn_{50at\%}$ (12)/PtCr layer 5B: $Pt_{51at\%}Cr_{49at\%}$ (300)] in Example 9 was changed as follows and were annealed under the same conditions to generate exchange coupling between the fixed magnetic layer and the antiferromagnetic layer.

Comparative Example 5

$Ir_{20at\%}Mn_{80at\%}$ (80)

Comparative Example 6

$Pt_{51at\%}Cr_{49at\%}$ (300)

Figure 18:
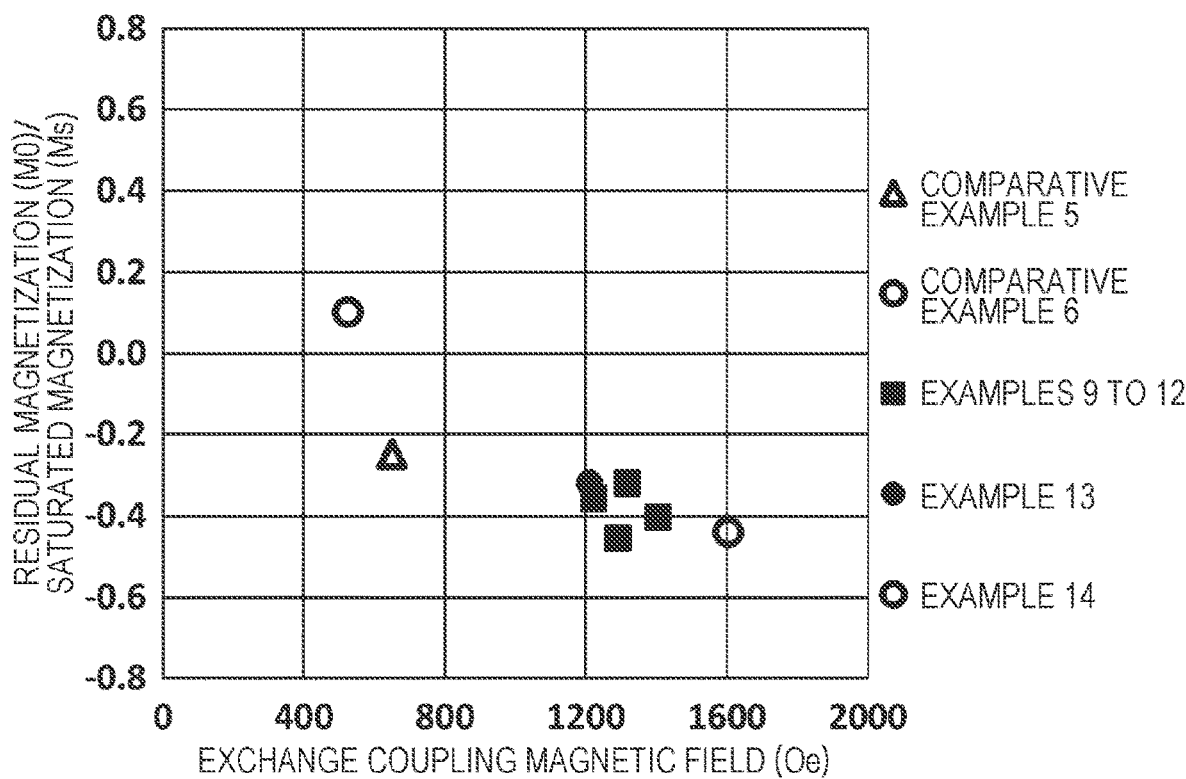
FIG. 18 is a graph showing residual magnetization (M0)/saturated magnetization (Ms) ratios in Examples 9 to 14 and Comparative Examples 5 and 6.
Figure 19:
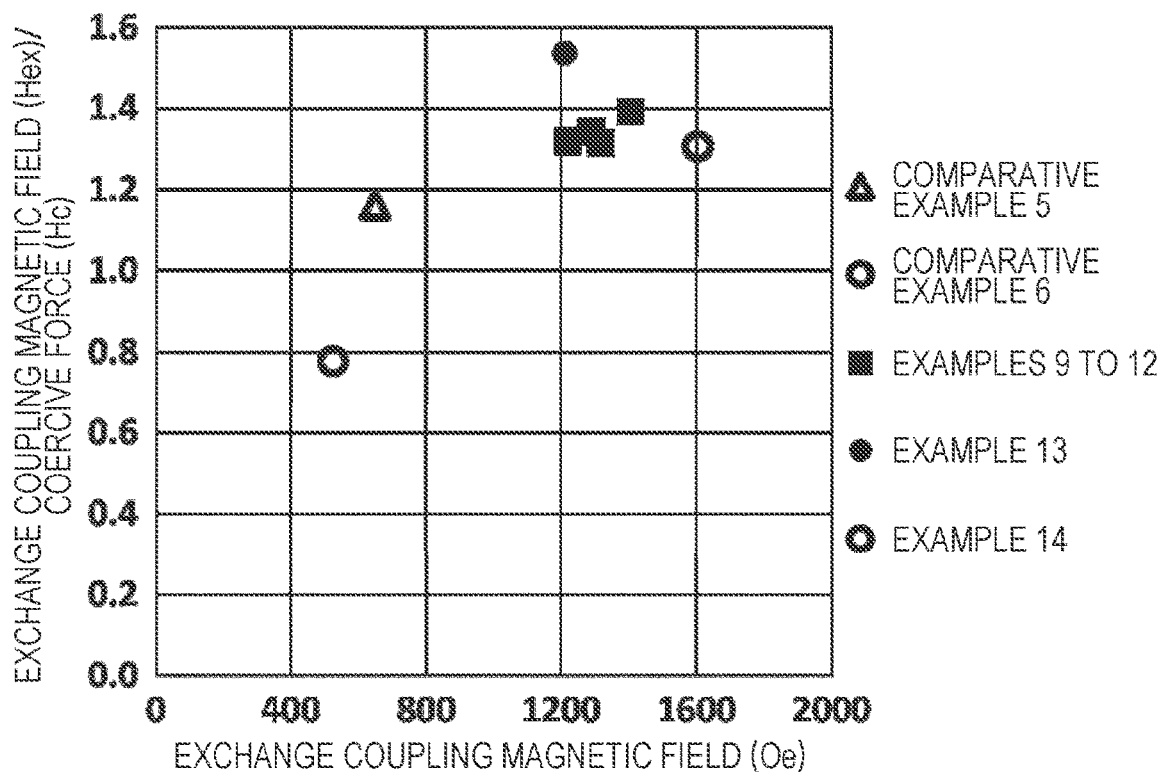
FIG. 19 is a graph showing exchange coupling magnetic field (Hex)/coercive force (Hc) ratios in Examples 9 to 14 and Comparative Examples 5 and 6.

The measurement results of Examples 9 to 14 and Comparative Examples 5 and 6 are shown in Table 3 and FIGS. 18 and 19.

TABLE 3

| | Example 9 | Example 10 | Example 11 | Example 12 | Example 13 | Example 14 | Comparative Example 5 | Comparative Example 6 |
|---|---|---|---|---|---|---|---|---|
| Exchange coupling magnetic field Hex (Oe) | 1318 | 1405 | 1223 | 1290 | 1211 | 1604 | 650 | 525 |
| Coercive force He (Oe) | 1003 | 1010 | 928 | 960 | 788 | 1229 | 560 | 675 |
| Residual magnetization M0/saturated magnetization Ms | −0.32 | −0.40 | −0.36 | −0.45 | −0.32 | −0.44 | −0.25 | 0.10 |
| Hex/Hc | 1.31 | 1.39 | 1.32 | 1.34 | 1.54 | 1.31 | 1.16 | 0.78 |

As shown in Table 3 and FIG. 18, in all Examples 9 to 14, the (residual magnetization M0)/(saturated magnetization Ms) ratio was large in the minus direction, compared to Comparative Examples 5 and 6. It is inferred that this property influenced the suppression of the change amount of the detection angle.

In addition, as shown in Table 3 and FIG. 19, in all Examples 9 to 14, the "exchange coupling magnetic field Hex"/"coercive force Hc" ratio was larger than those in Comparative Examples 5 and 6. It is inferred that this property also influenced the suppression of the change amount of the detection angle.

Incidentally, in Comparative Example 5 in which $Ir_{22at\%}Mn_{78at\%}$ was used as the antiferromagnetic layer, the (residual magnetization M0)/(saturated magnetization Ms) ratio was large in the minus direction and the (exchange coupling magnetic field Hex)/(coercive force Hc) ratio was large, compared to Comparative Example 6 in which $Pt_{51at\%}Cr_{49at\%}$ was used as the antiferromagnetic layer. The result that the change amount of the detection angle after the test in Comparative Example 2 using $Pt_{51at\%}Cr_{49at\%}$ was larger than that in Comparative Example 1 using $Ir_{20at\%}Mn_{80at\%}$ (see FIG. 14) can be understood to be caused by influence of the (residual magnetization M0)/(saturated magnetization Ms) ratio and the (exchange coupling magnetic field Hex)/(coercive force Hc) ratio, in addition to the magnitude of the exchange coupling magnetic field and the temperature characteristic thereof.

What is claimed is:

1. A position detection element for position detection based on a magnetic field that changes depending on position of a detection object, the position detection element comprising:
an exchange coupling film including a fixed magnetic layer and an antiferromagnetic layer stacked on the fixed magnetic layer, wherein:
the antiferromagnetic layer includes an X(Cr—Mn) layer containing X that is one or more elements selected from the group consisting of platinum group metals and Ni and containing Mn and Cr;
the X(Cr—Mn) layer includes a first region relatively closer to the fixed magnetic layer and a second region relatively farther from the fixed magnetic layer; and
a content of Mn in the first region is higher than a content of Mn in the second region.

2. The position detection element according to claim 1, wherein the first region is in contact with the fixed magnetic layer.

3. The position detection element according to claim 1, wherein the first region includes a portion having a ratio of the content of Mn to the content of Cr, Mn/Cr ratio, of 0.3 or more.

4. The position detection element according to claim 3, wherein the first region includes a portion having a Mn/Cr ratio of 1 or more.

5. The position detection element according to claim 1, wherein the antiferromagnetic layer is composed of a PtCr layer and an $X^0$Mn layer (where, $X^0$ is one or more elements selected from the group consisting of platinum group metals and Ni) stacked such that the $X^0$Mn layer is closer to the fixed magnetic layer than the PtCr layer.

6. The position detection element according to claim 1, wherein the antiferromagnetic layer is composed of a PtCr layer and a PtMn layer stacked in this order such that the PtMn layer is closer to the fixed magnetic layer.

7. The position detection element according to claim 6, wherein an IrMn layer is further stacked so as to be closer to the fixed magnetic layer than the PtMn layer.

8. A position detection element for detecting a position of a detection object based on a magnetic field that changes depending on position of the detection object, the position detection apparatus comprising:
an exchange coupling film including a fixed magnetic layer and an antiferromagnetic layer stacked on the fixed magnetic layer, wherein
the antiferromagnetic layer has an alternately stacked structure composed of three or more layers in which an $X^1$Cr layer (where, $X^1$ is one or more elements selected from the group consisting of platinum group metals and Ni) and an $X^2$Mn layer (where, $X^2$ is one or more elements selected from the group consisting of platinum group metals and Ni and is the same as or different from $X^1$) are alternately stacked.

9. The position detection element according to claim 8, wherein the $X^1$ is Pt, and the $X^2$ is Pt or Ir.

10. The position detection element according to claim 8, wherein the antiferromagnetic layer includes a unit stacking part in which a plurality of units each consisting of an $X^1$Cr layer and an $X^2$Mn layer are stacked.

11. The position detection element according to claim 10, wherein the antiferromagnetic layer includes the $X^1$Cr layer or the $X^2$Mn layer on the fixed magnetic layer side, in addition to the unit stacking part.

12. The position detection element according to claim 10, wherein the $X^1$Cr layers in the unit stacking part have the same thickness, the $X^2$Mn layers in the unit stacking part have the same thickness, and the thickness of the $X^1$Cr layers is larger than the thickness of the $X^2$Mn layers.

13. The position detection element according to claim 12, wherein a ratio of the thickness of the $X^1$Cr layers to the thickness of the $X^2$Mn layers is 5:1 to 100:1.

14. A position detection element for position detection based on a magnetic field that changes depending on position of a detection object, the position detection element comprising:
an exchange coupling film including a fixed magnetic layer and an antiferromagnetic layer stacked on the fixed magnetic layer, wherein
the antiferromagnetic layer includes an X(Cr—Mn) layer containing X that is one or more elements selected from the group consisting of platinum group metals and Ni and containing Mn and Cr;
the X(Cr—Mn) layer includes a first region relatively closer to the ferromagnetic layer and a second region relatively farther from the ferromagnetic layer; and
when the X(Cr—Mn) layer is measured by time-on-flight secondary ion mass spectrometry using a $Bi^+$ ion as a primary ion to determine a ratio of detected intensities of 7 types of ions related to Mn to detected intensities of 7 types ions excluding $Cr^+$ out of 8 types of ions to be measured related to Cr as a first intensity ratio,
the first intensity ratio in the first region is higher than the first intensity ratio in the second region, and
Mn is contained in the entire second region.

15. A position detection apparatus for detecting a position of a detection object based on a magnetic field that changes depending on position of the detection object, the position detection apparatus comprising:
a magnet attached to the detection object; and
a position detection element comprising:
an exchange coupling film including a fixed magnetic layer and an antiferromagnetic layer stacked on the fixed magnetic layer, wherein:
the antiferromagnetic layer includes an X(Cr—Mn) layer containing X that is one or more elements selected from the group consisting of platinum group metals and Ni and containing Mn and Cr;
the X(Cr—Mn) layer includes a first region relatively closer to the fixed magnetic layer and a second region relatively farther from the fixed magnetic layer; and
a content of Mn in the first region is higher than a content of Mn in the second region.

16. The position detection apparatus according to claim 15, wherein the detection object is a rotor, and an angle of rotation of the rotor is detected.

17. The position detection apparatus according to claim 15, comprising:
a plurality of the position detection elements on a single substrate, wherein the fixed magnetic layers of some of the plurality of the position detection elements have different fixed magnetization directions.

\* \* \* \* \*